United States Patent
Yamashita et al.

(10) Patent No.: US 6,506,321 B1
(45) Date of Patent: Jan. 14, 2003

(54) SILICON BASED CONDUCTIVE MATERIAL AND PROCESS FOR PRODUCTION THEREOF

(75) Inventors: Osamu Yamashita, Osaka (JP); Nobuhiro Sadatomi, Osaka (JP); Tsunekazu Saigo, Osaka (JP); Shunichi Haruyama, Osaka (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/529,955

(22) PCT Filed: Aug. 14, 1998

(86) PCT No.: PCT/JP98/03642

§ 371 (c)(1),
(2), (4) Date: Jun. 8, 2000

(87) PCT Pub. No.: WO99/22411

PCT Pub. Date: May 6, 1999

(30) Foreign Application Priority Data

Oct. 24, 1997 (JP) .............................................. 9-309933
Apr. 28, 1998 (JP) ........................................... 10-134354

(51) Int. Cl.$^7$ ............................ H01B 1/06; A01L 21/02
(52) U.S. Cl. .................... 252/521.3; 423/324; 423/344
(58) Field of Search ............................... 252/500, 512, 252/521.3, 62.3 T; 423/324, 344

(56) References Cited

U.S. PATENT DOCUMENTS 4,063,210 A * 12/1977 Collver .......................... 338/7
5,057,161 A * 10/1991 Komabayashi et al. ..... 136/240

FOREIGN PATENT DOCUMENTS

| EP | 0 193 331 | * | 9/1986 |
| JP | 63119589 | | 5/1988 |
| JP | 1276678 | | 11/1989 |
| JP | 38707 | | 1/1991 |
| JP | 3-74885 | * | 3/1991 |
| JP | 374885 | | 3/1991 |
| JP | 4-716 | | 1/1992 |
| JP | 4-137619 | | 5/1992 |
| JP | 7-321044 | * | 8/1995 |
| JP | 7321044 | | 12/1995 |

* cited by examiner

Primary Examiner—Mark Kopec
(74) Attorney, Agent, or Firm—Dykema Gossett PLLC

(57) ABSTRACT

A silicon based conductive material based on a semiconductor silicon and having an electric resistivity of $10^{-3}(\Omega \cdot m)$ or less at ambient temperature which has been unattainable heretofore, while facilitating production and handling. An electric resistivity of $10^{-6}$ ($\Omega \cdot m$) or less, which is common for conductors can be realized by adding relatively large quantities of various kinds of elements to silicon. The conductive material can be provided in a semiconductor silicon substrate in a desired pattern by ion beam implantation and patterning. It can be employed not only in the form of a substrate, a rod or a wire, but also in the form of fine particles dispersed in a resin or glass to be employed in various applications requiring conduction, including a conductive sheet material.

5 Claims, 6 Drawing Sheets

Fig, 1A
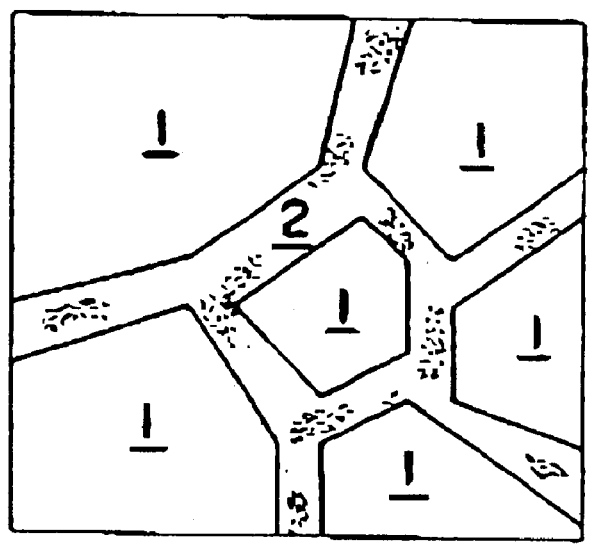
Fig, 1B
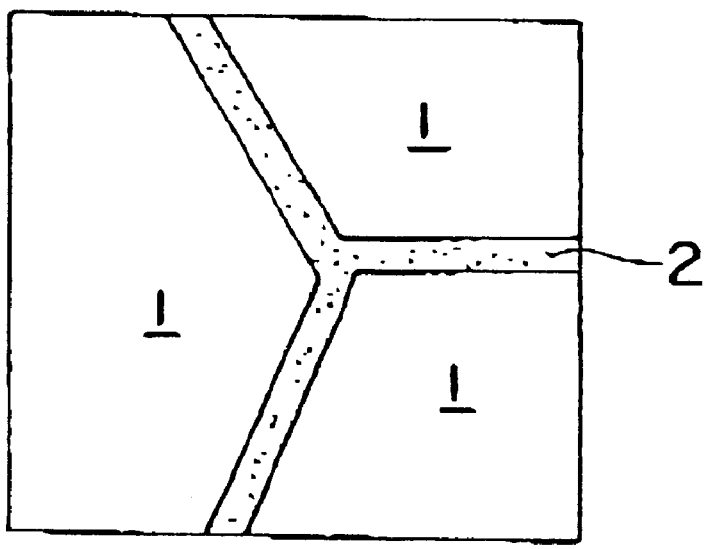

10 μm

10 μm

10 μm

10 μm

10 μm

10 μm

10 μm

10 μm

10 μm

10 μm

10 μm

10 μm

SILICON BASED CONDUCTIVE MATERIAL AND PROCESS FOR PRODUCTION THEREOF

TECHNICAL FIELD

This invention relates to a novel silicon-based conductive material in which the silicon is made to contain various elements in relatively large quantities, and more particularly to a novel silicon-based conductive material that allows substrates, chips, and the like to be made smaller and increases productivity by implanting phosphorus, boron, aluminum, or the like in a silicon substrate with:an ion beam in a pattern so that the required areas become conductive, wherein this silicon-based conductive material can be worked into a sheet or rod and utilized in connector terminals, contacts, and so forth, or can be made into fines and dispersed in a resin or glass to produce a conductive sheet material, for example, and is therefore suitable for any application that requires electrical conductivity.

BACKGROUND ART

Electrically conductive materials need to have a variety of characteristics. For example, in conductive wire applications, such as the wiring of semiconductor devices or various types of electronic and electrical devices, the electrical resistance must be low, corrosion resistance and mechanical properties need to be excellent, and connection must be easy. Copper and aluminum, as well as alloys such as copper alloys and aluminum alloys, have often been used for this purpose.

Depending on the package material, a variety of alloys have been employed for the lead frame materials of conductive sheets and strips, typified by semiconductor lead frame materials. Among those that have been used are Fe—Ni, Cu—Fe, Cu—Sn, and Cu—Zr systems.

Various alloy materials, such as those based on copper, carbon, silver, gold, or a platinum family metal, are used as contact point materials, which need to be conductive and resistant to arcing and wear.

Methods that have been- adopted for manufacturing conductive plastics, which are produced by imparting conductivity to a plastic (which is an insulator) and which are utilized for antistatic purposes, involve admixing carbon black, carbon fiber, or a metal powder or fiber into a resin.

The various electronic and electrical devices of today are more compact and lightweight because of higher packaging density, accomplished by putting resistors, capacitors, diodes, and transistors on a chip, but advances in chip-in-chip technology are making even higher packaging density possible, with the density of go-called printed wiring being increased (for example, copper foil of less than 20 $\mu$m is being used), and wire bonding is also becoming ultrafine.

Multilayer thin film circuits have been proposed in an effort to further advance chip-in-chip technology. A conduction thin film with a width of no more than 3 $\mu$m and a thickness of no more than 0.1 $\mu$m is formed, and three-dimensional wiring is achieved by through-holes in the semi-insulating films between layers. Aluminum films are used for these conduction thin films, and copper films are increasingly being employed in CPU applications.

Metals and alloys are used for conductive wires, such as the wiring of semiconductor devices or various: types-of electronic-and electrical devices, and in addition to their use as multilayer thin film circuits, these materials. have also been used as sheets, strips, and wires so as to allow connection to a mounting substrate or semiconductor chip, but this has been an impediment to increasing fineness and density and obtaining a smaller and lighter product.

The inventors came to the conclusion that if the required conductivity could be ensured without using conductive wires or the like on the chip, as is the case with an ordinary silicon substrate or other such semiconductor device substrate then devices could be made thinner and smaller, a reduction in the number of parts could be achieved, and various devices could be packaged more compactly on a single substrate.

The electrical resistivity p of a semiconductor is generally held to be $10^{-2}$ to $10^9$ ($\Omega$·m). Silicon is a semiconductor with a diamond structure, and its electrical resistivity p is $2.3\times10^5$ ($\Omega$·m), but it can be made into a p- or n-type semiconductor by adding boron or phosphorus as impurities. Silicon can also be used over a wide range of temperatures, and as a semiconductor it allows current to be controlled, and is therefore widely used in devices today. This pn control is achieved by doping the silicon with only a tiny amount of impurities (about $\frac{1}{10,000}$th), and it is known that pn control is impossible with doping in larger quantities.

Meanwhile, it is known that silicon is metallized when a large quantity of impurities is introduced. An article titled "Low-Temperature Magnetoresistance of a Disordered Metal" by T. F. Rosembaum and R. F. Milligan (Physical Review Letters, pp. 1758–1761, dated Dec. 14, 1981) reports on the magnetoresistance of metallic Si-P at 100 mK. It is reported that the critical density at a temperature of 3 mK is $n_c=3.74\times10^{18}$ cm$^{-3}$, and the electrical resistivity p is $2\times10^{-2}$ ($\Omega$·m).

Also, salicide technology, in which a silicide layer is formed on the gate electrodes and diffusion layer surfaces of the source and drain, has been developed in an effort to lower resistance within an element in the manufacture of a MOSFET, and materials that have been studied include $TiSi_2$, $NiSi$, and $CoSi_2$.

None of the above-mentioned silicon semiconductors, metallic Si-P, or suicides had an electrical resistivity p that was any better than that of semiconductors ($10^{-2}$ ($\Omega$·m)), and could not be used as conductors for "carrying current."

As mentioned above, however, system integration is possible if polycrystalline Si-TFT can be formed on a single glass substrate and various devices such as microprocessors formed on the surrounding substrate, but it is believed that packaging would be easier if conduction could be ensured with the very material used to form a film on the glass substrate, and particularly a silicon-based material other than a metal.

DISCLOSURE OF THE INVENTION

It is an object of the present invention to provide a silicon-based conductive material that is based primarily on semiconductor silicon, can be easily manufactured, is easy to handle, has an electrical resistivity at normal temperature of $10^{-3}$ ($\Omega$·m) or less, which could not be achieved up to now, and furthermore attains the electrical resistivity that is commonly found in semiconductors ($10^{-6}$ ($\Omega$·m) or less), and can be provided in the required pattern within a semiconductor silicon substrate, or made into a substrate, rod, or wire, or can be made into fines and dispersed in a resin or glass to produce a conductive sheet material, and is therefore suitable for any application that requires electrical conductivity.

The inventors conducted various studies aimed at finding a material based primarily on semiconductor silicon and with which an electrical resistivity at normal temperature of $10^{-3}$ (Ω·m) or less, or even $10^{-6}$ (Ω·m) or less, could be attained, which was impossible in the past. In the course of this investigation, they turned their attention to the conventional belief that if various dopants were added to silicon alone, the energy state density decreased and the Seebeck coefficient would also go down steadily as the added amount was increased, that is, the belief that the decreases in energy state density and the Seebeck coefficient were a result of an increase in the band width of the impurity level in the band gap along with an increase in the carrier concentration (A. F. Joffe: Semiconductor Thermoelements and Thermoelectric Cooling, Infosearch, London, 1957).

In view of this, the inventors came to the conclusion that if the carriers are at a certain specific concentration, there is an electron correlation or hole correlation at work between the electrons or holes that are the carriers, and conversely that the energy state density of the carriers is higher through the segregation of the carriers in the semiconductor, that is to say that Anderson segregation is occurring (P. W. Anderson, Phys. Rev., 102 (1958), 1008). In other words, even though the carrier concentration increased up to a specific density, electrical resistance continued to decrease, but the inventors thought that the Seebeck coefficient might increase sharply at a certain carrier concentration, which would result in a marked increase in the performance index.

The inventors learned that adding Group 3 or 5 elements to silicon alone causes the Seebeck coefficient to be equivalent or higher on the basis of the above assumption, and far higher at a specific carrier concenrtration, compared to the Si—Ge and Fe—Si systems known in the past, and confirmed the validity of the above assumption through various experiments, without losing the fundamental advantages had by silicon alone. They also discovered a favorable composition and texture for a thermoelectric conversion material.

On the basis of their findings about novel silicon-based conductive materials based on the above-mentioned assumptions, the inventors produced silicon-based materials by adding various elements for producing a p-type semi-conductor and elements for producing an n-type semiconductor (elements other than Group 3 or 5 elements) to silicon, and examined how the doping amounts thereof are related to carrier concentration and electrical resistance. As a result they learned that electrical resistance can be lowered by adjusting the carrier concentration by the addition of the above-mentioned various dopants. For instance, if zinc, boron, phosphorus, aluminum, gallium, neodymium, yttrium, or the like is contained in an amount of at least 0.001 at %, the result will be a p-type semiconductor with an electrical resistivity p of $1 \times 10^{-3}$ (Ω·m) or less, and if the amount contained is at least 1 at %, the conductive material will have an electrical resistivity of $1 \times 10^{-6}$ (Ω·m) or less, and in a favorable case $1 \times 10^{-7}$ (Ω·m) or less.

The inventors further learned that it is particularly effective for the dopants to be one or more members of the group consisting of dopants A (Be, Mg, Ca, Sr, Ba, Zn, Cd, Hg, B, Al, Ga, In, Tl) and transition metal elements $M_1$ (Y, MO, Zr) which are known as dopants for making silicon into a p-type semiconductor, and dopants B (N, P, As, Sb, Bi, O, S, Se, Te), transition metal elements $M_2$ (Ti, V, Cr, Mn, Fe, Co, Ni, Cu, Nb, Ru, Rh, Pd, Ag, Hf, Ta, W, Re, Os, Ir, Pt, Au; where Fe accounts for 10 at % or less) and rare earth elements RE (La, Ce, Pr, Nd, Pm, Sm, Eu, Gd, Tb, Dy, Ho, Er, Yb, Lu) which are known as dopants for making silicon into a n-type semiconductor. These elements are especially effective when they are added singly or in combination. Further, a similar conductive material will be obtained even with elements other than those listed above.

The inventors also found that the previously discovered favorable composition and texture for a thermoelectric conversion material allow the product to exhibit good characteristics as a conductive material as well. Further investigation aimed at lowering the electrical resistivity ρ revealed that there are no elements unsuitable as dopants to silicon, the optimal added amount varies with the selected element, and this range tends to vary when two or more dopants are used; that a conductive material with any electrical resistivity p or around the $10^{-7}$ (Ω·m) can be obtained, regardless of the texture state, by manufacturing the conductive material by a method and within a range that does not result in metallization or compounding at the added amount corresponding to the selected element; and that conductive lines can be freely provided toga silicon substrate, particularly using ion implantation. These discoveries led to the present invention.

Meanwhile, the inventors examined various doping methods in which silicon is doped with a variety of elements, and as much as possible the dopants are added in amounts that will result in the specified component proportions in order to obtain a silicon-based conductive material with low resistivity and in which the carrier concentration is $10^{17}$ to $10^{21}$ (M/m³). As a result, they found that compositional deviation can be minimized by producing a compound of silicon and dopants ahead of time, and adding to silicon alone and melting in the form of a compound, so that the melting point of the added compound is closer to the melting point of silicon.

Specifically, they learned that the carrier concentration can be controlled more uniformly and more precisely by using a silicon-based compound such as $Al_4Si$, $B_4Si$, $Mg_2Si$, $Ba_2Si$, $SiP$, $SiO_2$, $SiS_2$, or $Si_3N_4$ in the doping of Group 3 elements such as B, Al, Ga, In, and Tl and Group 5 elements such as N, P, As, Sb, and Bi, or Group 2 elements such as Be, Mg, Ca, Sr, and Ba, Group 2B elements such as Zn, Cd, and Hg, and Group 6 elements such as O, S, Se, Te, and Po, for example, as the dopants used to control the carrier concentration in the silicon semiconductor. Further investigation was conducted to find whether a silicon raw material with even lower purity could be used, and as a result even a raw material with a purity of 3N could be used satisfactorily.

Furthermore, the inventors conducted various investigations aimed at further lowering the resistivity of a silicon-based conductive material, which led to the hypothesis that the above-mentioned problems could be solved by creating a metal conduction grain boundary phase that is discontinuous with the very fine semiconductor grain phase in the semiconductor bulk. The term "metal conduction grain boundary phase" as used here refers to a metal phase or semi-metal phase that undergoes a Mott transition and has a carrier concentration of at least $10^{18}$ (M/m³).

In view of this, the inventors realized that the semiconductor phase and the metal conduction grain boundary phase are indistinct with a powder metallurgy process because dopants are present in a large quantity in the semiconductor crystal grains after sintering and that the electrical resistivity of the semiconductor phase decreases. They therefore conducted an investigation aimed at allowing the semiconductor grain phase to be separated from the metal conduction grain boundary phase by arc melting.

In order to lower the thermal conductivity of a silicon semiconductor, the inventors added Group 2 and 3 elements to silicon alone with a p-type semiconductor, and added Group 5 and 6 elements to silicon alone with an n-type semiconductor, after which each was arc melted in an argon atmosphere, immediately after which each was quenched by being held down from above with a chiller, for example, which produced thermoelectric conversion materials having fine crystal grains with an average diameter of 0.1 to 5 $\mu$m. The electrical resistance of these materials was examined, which revealed that there was almost no precipitation of dopants at the grain boundary in silicon semiconductor bulk when the total amount of the various elements added to silicon alone was less than 0.001 at %, so the electrical resistivity was high, but when the amount exceeded 0.001 at %, some of the dopants began to precipitate at the grain boundary, and at 1.0 at % this precipitation effect markedly lowered electrical resistivity.

Specifically, the present invention is a silicon-based conductive material, in which the silicon contains at least one other element in an amount of 0.1 to 25 at %, or over 25 at % depending on the type of selected element or when two or more are used, and similarly contains preferably 0.5 to 20 at % depending on the type of element selected from the group of dopants for producing the above-mentioned p- or n-type semiconductors or when two or more elements are used, and has an electrical resistivity $\rho$ of $1 \times 10^{-3}$ ($\Omega \cdot$m) or less, and in a favorable case $1 \times 10^{-6}$ ($\Omega \cdot$m) or less.

The silicon-based conductive material of the present invention, when quenched by any of various methods after melting, has good conduction characteristics and is composed of a semiconductor grain phase and a conductor grain phase of a metal or semi-metal dispersed in bulk.

Also, the silicon-based conductive material of the present invention has good conduction characteristics when atoms of another element are substantially dispersed among the silicon lattices by ion implantation or another such method.

BRIEF DESCRIPTION OF THE DRAWINGS

FIG. 1A is a diagrammatic representation of the crystal texture in the silicon-based conductive material of the present invention which has been quenched after arc melting, and FIG. 1B is a diagrammatic representation of the crystal texture in a semiconductor that was not quenched after arc melting;

FIG. 2 consists of sectional EPMA analysis photograph drawings (magnified 100 times) illustrating the crystal texture in a material not quenched after arc melting, where

FIG. 3 consists of sectional EPMA analysis photograph drawings (magnified 100 times). illustrating the crystal texture in the silicon-based conductive material of the present invention, which was quenched after arc melting, where

FIG. 4 consists of sectional EPMA analysis photograph drawings (magnified 100 times) illustrating the crystal texture in a material not quenched after arc melting, where

FIG. 5 consists of sectional EPMA analysis photograph drawings (magnified 100 times) illustrating the crystal texture in the silicon-based conductive material of the present invention, which was quenched after arc melting, where

BEST MODE FOR CARRYING OUT THE INVENTION

Figure 2A:
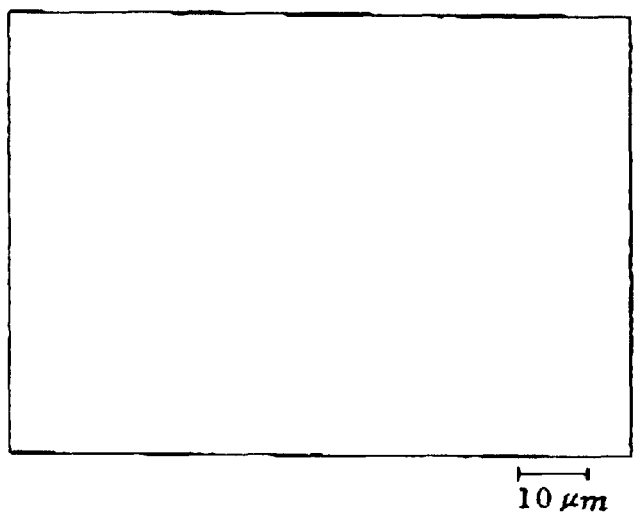
FIG. 2A shows no addition.

In the present invention, there are no particular restrictions on the added elements, which may be any of the above-mentioned elements for making silicon into a p- or n-type semiconductor, or may be another element. If elements whose ionic radius is too different are added, however, the majority will precipitate at the grain boundary, so it is preferable to use elements whose ionic radius is relatively close to that of silicon. If the total amount of the elements, whether used singly or in combinations, added to silicon alone is less than 0.001 at % the majority of the dopants will precipitate at the grain boundary in the silicon semiconductor bulk, and the electrical resistivity will decrease, so the added amount is at least 0.001 at %. With some dopants, however, the desired electrical resistivity will not be obtained at 0.001 at %, so the preferred amount is at least 0.1 at %, with at least 0.5 at % being even better, and at least 1 at % being especially good.

There are no particular restrictions on the upper limit to the amount of dopant added in the present invention, but there are various cases for elements with which a metal conduction grain boundary phase that is discontinuous with a very fine semiconductor grain phase in the semiconductor bulk can be created, and the optimal added amount thereof, or for combinations of elements and the added amounts thereof. Also, if the added amount is too large, the dopants will not be partially replaced by silicon atoms in the crystals, a separate crystal phase will precipitate, and the resistance value cannot be lowered, so appropriate selections must be made with an eye toward reducing the resistance value. Particularly when a combination of elements is added, there will be cases when the preferred added amount is different from the added amount when a single element is added, and once again appropriate selections must be made for the purpose of reducing the resistance value.

For instance, dopants for making the silicon into a p-type semiconductor are dopants A (Be, Mg, Ca, Sr, Ba, Zn, Cd, Hg, B, Al, Ga, In, Tl) and transition metal elements $M_1$ (Y, Mo, Zr), and dopants for making the silicon into an n-type semiconductor are dopants B (N, P, As, Sb, Bi, O, S, Se, Te), transition metal elements $M_2$ (Ti, V, Cr, Mn, Fe, Co, Ni, Cu, Nb, Ru, Rh, Pd, Ag, Hf, Ta, W, Re, Os, Ir, Pt, Au; where Fe accounts for 10 at % or less), and rare earth elements RE (La, Ce, Pr, P Gd, Tb, Dy, Ho, Er, Yb, Lu). A decrease in electrical resistivity can be achieved by selecting the elements and adjusted the amounts in which they are added so that the carrier concentration will be within a certain range ($10^{17}$ to $10^{21}$ (M/m$^3$)), depending on whether these elements are added singly or in combinations.

When a decrease in electrical resistivity is achieved through control of the carrier concentration by the above-mentioned selection of elements and the amounts in which they are added, the dopants for producing a p-type semiconductor and the dopants for producing an n-type semiconductor should each be contained in an amount of 10 at % or less, and in a total amount of 20 at % or less, with the carrier concentration kept between $10^{17}$ and $10^{21}$ (M/m$^3$).

It is also possible to select the elements and adjust the amounts in which they are added so that the carrier concentration is over $10^{21}$ (M/m$^3$), which can be done according to the targeted electrical resistivity.

In the present invention, the carrier concentration can be controlled more uniformly and more precisely by melting a silicon-based compound such as Al$_4$Si, B$_4$Si, Mg$_2$Si, Ba$_2$Si, SiP, SiO$_2$, SiS$_2$, or Si$_3$N$_4$ in the doping of Group 3 elements such as B, Al, Ga, In, and Tl and Group 5 elements such as N, P, As, Sb, and Bi, or Group 2 elements such as Be, Mg, Ca, Sr, and Ba, Group 2B elements such as Zn, Cd, and Hg, and Group 6 elements such as O, S, Se, Te, and Po, for example, because silicon is doped with various elements to make it into a p- or n-type semiconductor, and the carrier concentration is adjusted to between $10^{17}$ and $10^{21}$ (M/m$^3$). Further investigation was conducted to find whether a silicon raw material with even lower purity could be used, and as a result even a raw material with a purity of 3N could be used satisfactorily.

Furthermore, thermal conductivity can also be controlled along with electrical resistivity by selecting the elements and adjusting the amounts in which they are added in the present invention. For example, adding at least one type of Group 3 element and at least one type of Group 5 element and controlling the carrier concentration to a range of $10^{19}$ to $10^{21}$ (M/m$^3$) makes it possible to disrupt the crystal structure without changing the carrier concentration in the silicon, allowing thermal conductivity to be decreased 30 to 90% to 50 to 150 W/m·K or less at room temperature.

In the above example, a p-type semiconductor is obtained if the Group 3 element is contained in an amount 0.3 to 5 at % larger than that of the Group 5 element, and an n-type semiconductor is obtained if the Group 5 element is contained in an amount 0.3 to 5 at % larger than that of the Group 3 element. By adding a Group 3–5 compound semiconductor or a Group 2–6 compound. semiconductor to silicon, and further adding at least one type of Group 3 element or Group 5 element and controlling the carrier concentration to a range of $10^{19}$ to $10^{21}$ (M/m$^3$), it is possible to disrupt the crystal structure without changing the carrier concentration in the silicon, so thermal conductivity can be kept to 150 W/m·K or less at room temperature.

Also, if the Group 4 elements of germanium, carbon, and tin are contained in silicon in an amount of 0.1 to 5 at %, and part of the elemental silicon is substituted with a Group 4 element with a different atomic weight, there will be greater scattering of phonons in the crystals, and it will be possible to decrease the thermal conductivity of the semiconductor by 20 to 90% and keep it under 150 W/m·K at room temperature.

The amounts in which the main dopants are added in the present invention and the electrical resistivity are given below.

| | |
|---|---|
| Zn 7.0 at % | 4.4 × 10$^{-7}$ Ω · m (25° C.) |
| Al 7.0 at % | 3.6 × 10$^{-7}$ Ω · m (25° C.) |
| Al 8.0 at %, Y 3.0 at % | 7.60 × 10$^{-7}$ Ω · m (25° C.) |
| Al 8.0 at %, Zr 3.0 at % | 7.60 × 10$^{-7}$ Ω · m (25° C.) |
| Nd 15.0 at % | 8.3 × 10$^{-7}$ Ω · m (25° C.) |
| Bi 6.0 at %, Ti 6.0 at % | 8.2 × 10$^{-7}$ Ω · m (25° C.) |
| P 15.0 at % | 9.40 × 10$^{-7}$ Ω · m (25° C.) |
| Gs 8.0 at %, Zr 6.0 at % | 9.60 × 10$^{-7}$ Ω · m (25° C.) |
| Bi 6.0 at %, Ni 6.0 at % | 1.1 × 10$^{-6}$ Ω · m (25° C.) |
| P 10.0 at % | 1.1 × 10$^{-6}$ Ω · m (25° C.) |
| Al 4.0 at %, Y 2.0 at % | 1.1 × 10$^{-6}$ Ω · m (25° C.) |

-continued

| | |
|---|---|
| As 3.0 at % | 1.2 × 10$^{-6}$ Ω · m (25° C.) |
| Bi 15.0 at % | 1.2 × 10$^{-6}$ Ω · m (25° C.) |
| Zn 1.0.at %, Cd 1.0 at % | 1.2 × 10$^{-6}$ Ω · m (25° C.) |
| Al 3.0 at %, Zr 2.0 at % | 1.3 × 10$^{-6}$ Ω · m (25° C.) |
| Fe 15.0 at % | 1.5 × 10$^{-6}$ Ω · m (25° C.) |
| B 8.0 at %, P 2.0 at % | 2.4 × 10$^{-6}$ Ω · m (25° C.) |

For reference, electrical resistivity is listed here for the main conductors: copper 1.72×10$^{-8}$ Ω·m, aluminum 2.75× 10$^{-8}$ Ω·m, iron 9.8×10$^{-8}$ Ω·m, tin 1.14×10$^{-7}$ Ω·m, and lead 2.19×10$^{-7}$ Ω·m.

In the present invention, it is preferable for the compound of silicon and dopant to be a relatively stable compound, and while the manufacturing method thereof will vary with the compound, compounds that can be manufactured by arc melting, high-frequency melting, or the like have higher melting points, and are therefore preferred because there is less scattering during melting.

A silicon-based conductive material composed of a semiconductor grain phase and a conductor grain phase of a metal or semi-metal dispersed in bulk can be obtained with the present invention by producing a melt such that silicon contains the required amount of one or more types of dopant for creating a p- or n-type semiconductor, and quenching the melt by any of various methods, such as quenching the melt with a chiller, or splat-cooling the melt through contact with a rotating roll so that most or all of it is rendered amorphous, and then performing a heat treatment.

The silicon-based conductive material of the present invention that is based primarily on silicon can be used in all applications where electrical conductivity is required, and there are no particular restrictions on the average grain diameter thereof. Still, if the average grain diameter is between 0.1 and 5 μm, the crystal grains will be finer and the metal grain boundary phase will be present in a dispersed state, and therefore electron or hole carriers will be able to move by hopping over this dispersed metal grain boundary phase and decrease the electrical resistivity.

Figure 6:
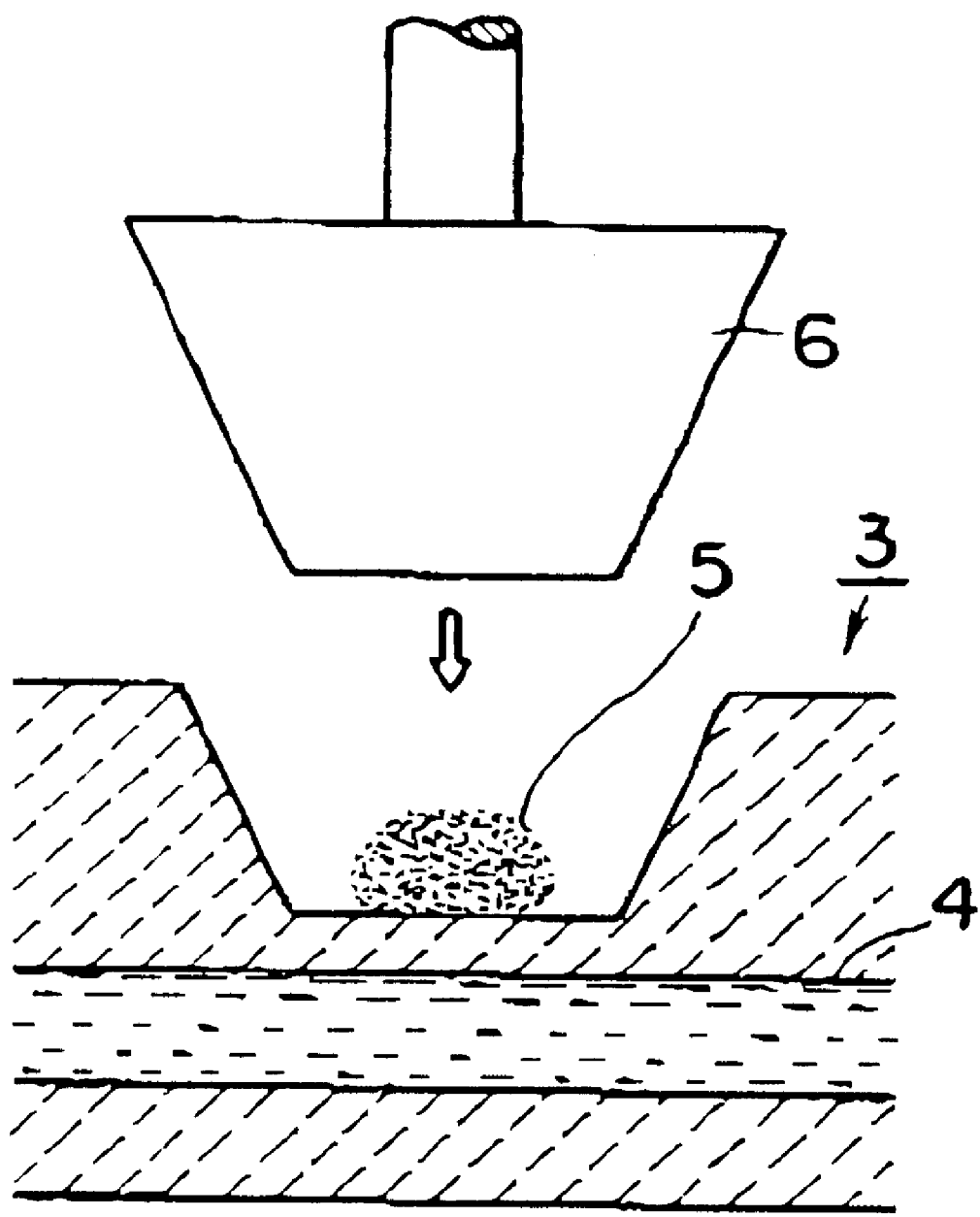
FIG. 6 is a diagram of an example of the cooling after arc melting.

Any known quenching method can be employed in the present invention. For example, immediately after arc melting, as shown in FIG. 6, a melting crucible 3 is set up for water-cooling by the installation of a cooling water pipe 4 in the thick part of the crucible, and the molten ingot 5 inside this melting crucible 3 is quenched by being sandwiched between the water-cooled melting crucible 3 and a chiller 6 made of a metal with good thermal conductivity. This causes the molten ingot 5 to have a fine crystal grain diameter.

Specifically, as shown in FIG. 1A, electrical resistivity is lower if there is dispersed a metal or semi-metal grain boundary phase whose crystals have been made into fines by quenching. When quenching is not performed after arc melting, however, as shown in FIG. 1B, the diameter of the crystal particles 1 increases, the metal or semi-metal crystal grain boundary phase 2 partially links up, and the carriers in the grain boundary phase 2 move so as to cancel out the thermoelectromotive force of the semiconductor phase generated by the temperature gradient, and this markedly lowers the electrical resistivity.

Figure 2B:
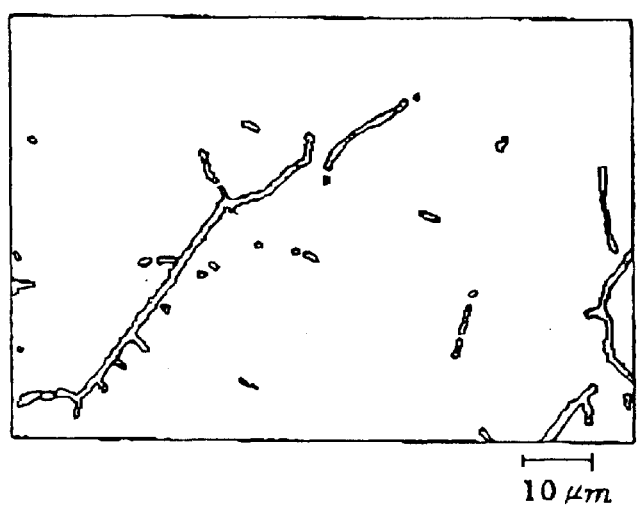
FIG. 2B shows a p-type semiconductor to which aluminum was added in an amount of 1.0 wt %
Figure 2C:
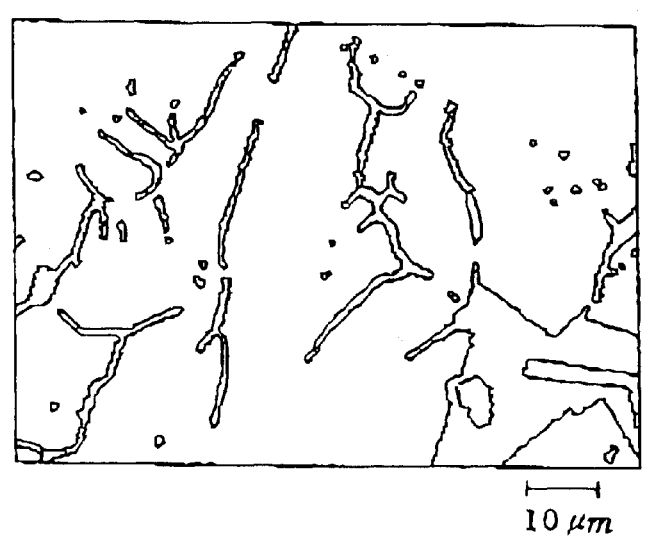
FIG. 2C shows a p-type semiconductor to which aluminum was added in an amount of 3.0 wt %.
Figure 3A:
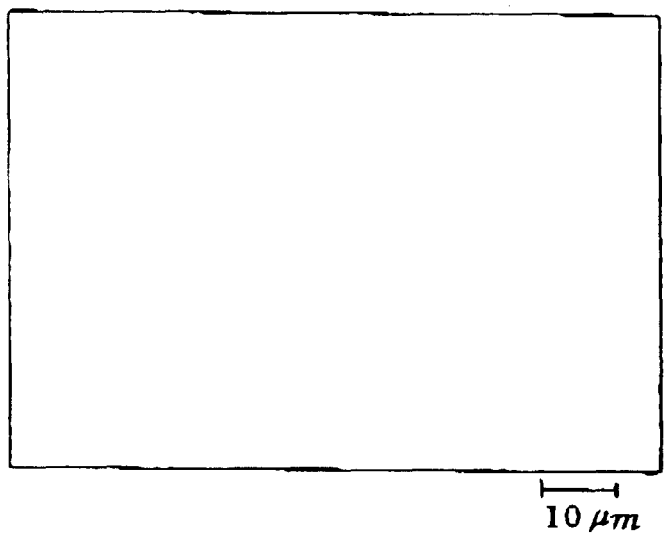
FIG. 3A shows no addition.
Figure 3B:
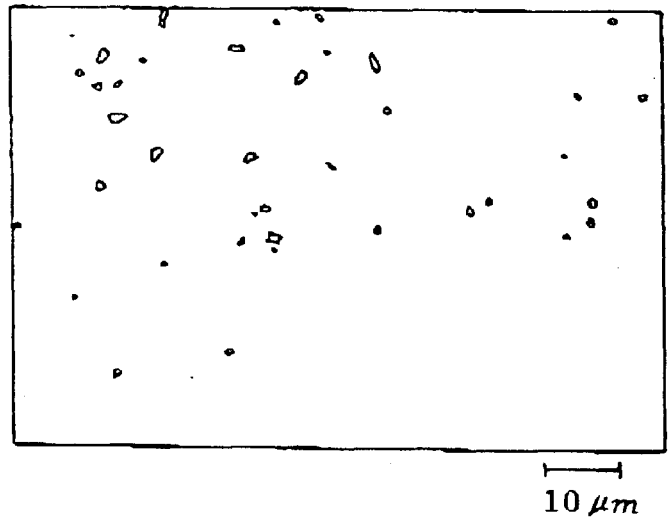
FIG. 3B shows a p-type semiconductor to which aluminum was added in an amount of 1.0 wt %.
Figure 3C:
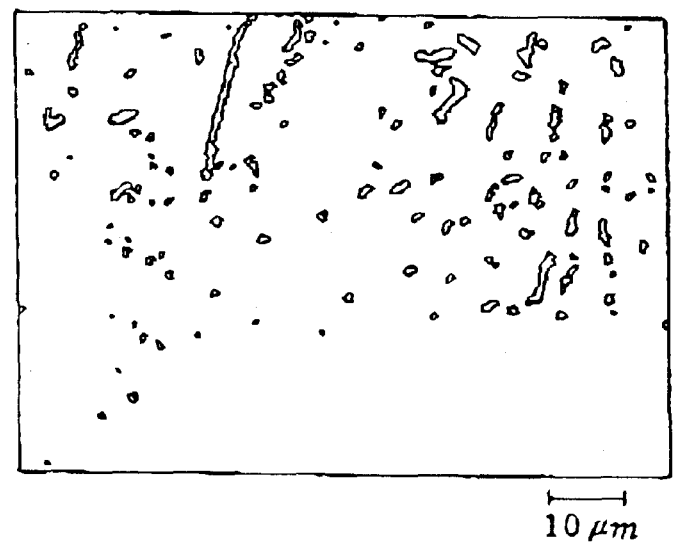
FIG. 3C shows a p-type semiconductor to which aluminum was added in an amount of 3.0 wt %.

FIGS. 2 and 3 consist of sectional XMA analysis photograph drawings (magnified 100 times) illustrating the crystal texture in a semiconductor. FIGS. 2A and 3A show no addition, while FIGS. 2B and 3B show a p-type semiconductor to which aluminum was added in an amount of 1.0 wt %, and FIGS. 2C and 3C show a p-type semiconductor to which aluminum was added in an amount of 3.0 wt %. Quenching was not performed, after arc melting in any of FIG. 2, whereas quenching was performed after arc melting in FIG. 3. Specifically, it can be clearly seen that when the required dopant is added and quenching is performed after arc melting, the crystals become finer and the metal or semi-metal grain boundary phase is dispersed, as shown in FIG. 1A, which is a diagrammatic representation of the crystal texture in this semiconductor.

Figure 4A:
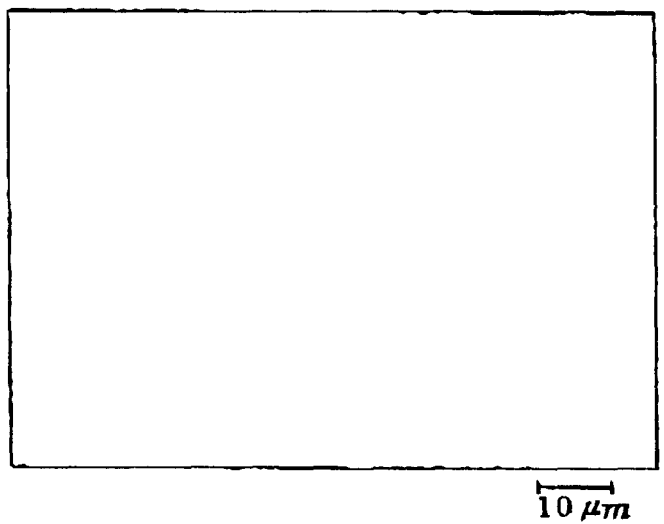
FIG. 4A shows no addition.
Figure 4B:
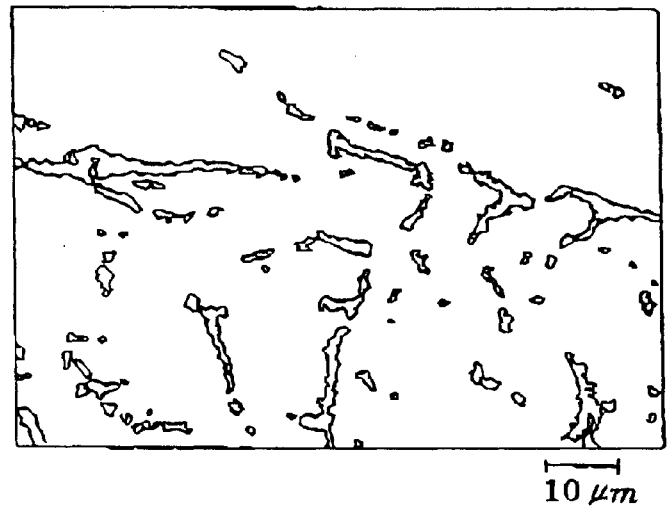
FIG. 4B shows an n-type semiconductor to which aluminum was added in an amount of 1.0 wt %.
Figure 4C:
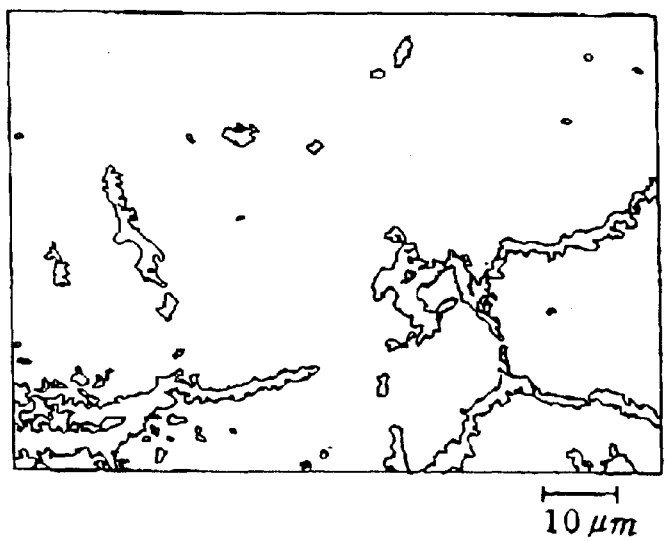
FIG. 4C shows an n-type semiconductor to which aluminum was added in an amount of 3.0 wt %.
Figure 5A:
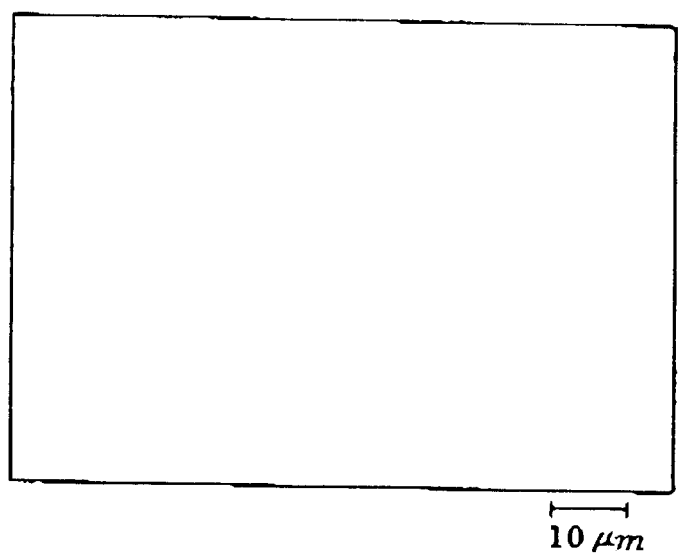
FIG. 5A shows no addition.
Figure 5B:
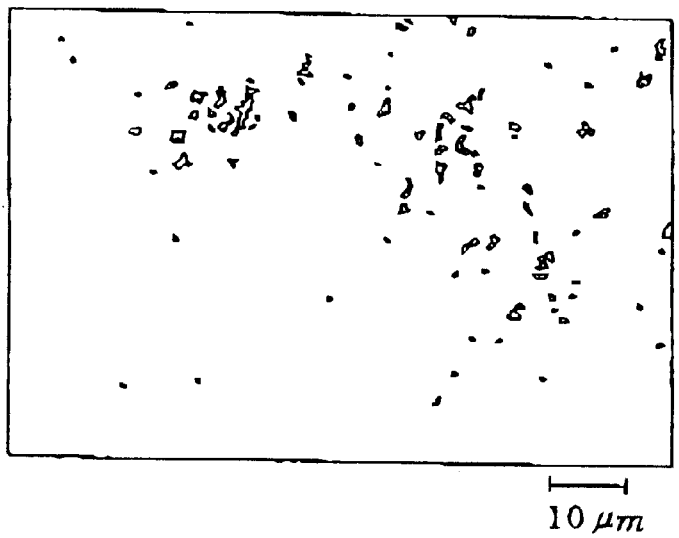
FIG. 5B shows an n-type semiconductor to which aluminum was added in an amount of 1.0 wt %.
Figure 5C:
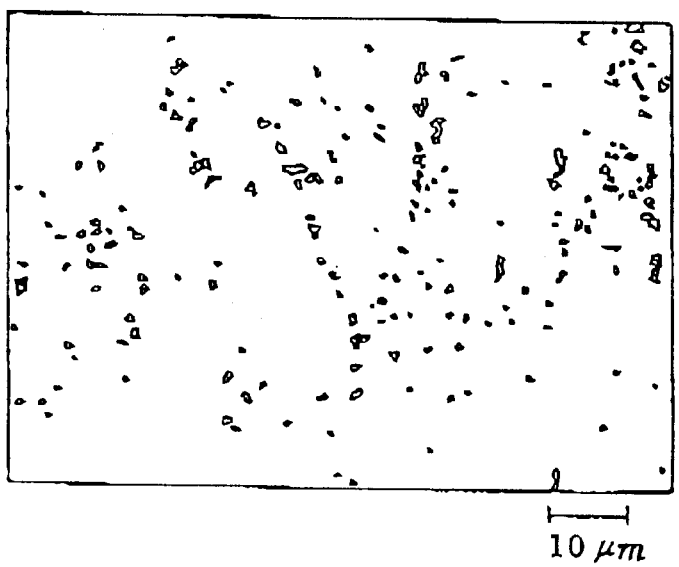
FIG. 5C shows an n-type semiconductor to which aluminum was added in an amount of 3.0 wt %.

FIGS. 4 and 5 similarly consist. of sectional XMA analysis photograph drawings (magnified, 100 times). FIGS. 4A and 5A show no addition, while FIGS. 4B and 5B show an n-type semiconductor to which phosphorus was added in an amount of 1.0 wt %, and FIGS. 4C and 5C show an n-type semiconductor to which phosphorus was added in an amount of 3.0 wt %. Quenching was not performed after arc melting in any of FIGS. 4, whereas quenching was performed after arc melting in FIGS. 5. Specifically, it can be clearly seen that when the required dopant is added and quenching is performed after arc melting, the crystals become finer and the metal or semi-metal grain boundary phase is dispersed, as shown in FIG. 1A, which is a diagrammatic representation of the crystal texture in this semiconductor.

Any known method can be employed for quenching the high-temperature silicon-based melt as long as the required average grain diameter can be maintained. The molten ingot may be cooled by rolling, or the melt may be cooled in the form of a sheet between two rolls. Another method that may be employed is to splat-cool the melt in the form of a thin sheet or ribbon between two rolls to render most or all of it amorphous, and then perform a heat treatment under conditions suitably selected such that the average grain diameter will be within the above range.

It is also possible with the present invention to obtain a porous conductive material with a porosity of 5 to 40% by melting a dopant for making a p-type or n-type semiconductor such that it is contained, either singly or in combination, in the required amount in silicon, cooling this melt to obtain an ingot, ribbon, flakes, or other such semiconductor material, pulverizing this product into a powder of the required particle size, subjecting this powder to microcrystallization by mechanical alloying, and then subjecting it to low-temperature hot pressing. Here again, there was no significant change in electrical resistance when the grain size was reduced (to an average grain diameter of 0.1 to 5.0 $\mu$m), but electrical resistance did decrease outside of this range.

In short, after the above-mentioned composition is melted, the melt is quenched with a chiller, or the melt is splat-cooled with rotating rolls to render most or all of it amorphous, after which a heat treatment is performed, for example, and the melt is quenched. As a result, the silicon-based conductive material of the present invention has a fine grain diameter and the metal grain boundary phase is dispersed, and consequently electron or hole carriers move by hopping over this dispersed metal grain boundary phase and decrease the electrical resistivity.

Depending on the type of dopant or combination thereof, a method in which quenching follows melting need not be employed, and in some cases a texture composed of a semiconductor grain phase and a conductor grain boundary phase of a metal or semi-metal dispersed in bulk can be obtained with a method in which the melt is cooled in the usual way and then heat treated to effect grain growth. The above-mentioned texture will be obtained more easily, however, with a method in which quenching follows melting.

The silicon-based conductive material of the present invention is characterized by being composed of a semiconductor grain phase and a conductor grain boundary phase of a metal or semi-metal dispersed in bulk, but it is also possible to obtain a conductive material when atoms of another element are substantially dispersed among the silicon lattices by ion implantation or another such method.

Ion implantation allows phosphorus or boron to be implanted in an extremely fine pattern with an ion beam, as in the production of integrated circuits for CPU's and the like nowadays, but even if the precision is not this high, any apparatus can be used as long as the implantation precision is suitable for an application requiring conductivity, although a preferable structure will cool the silicon substrate and keep it at as low a temperature as possible.

The silicon-based conductive material of the present invention can be used in any form desired, such as a sheet, rod, spheres, ribbon, or microparticles, as dictated by the application requiring conductivity. For instance, the raw material melted along with the required elements can be molded into a conductive part in the form of a sheet, rod, wire, or other required shape, or phosphorus or boron can be implanted in the above-mentioned silicon substrate with an ion beam in a pattern and this product itself used. In other words, this is a form in which a monocrystalline or polycrystalline silicon substrate is made to contain a dopant in just those areas where conductivity is needed.

A conductive connector part can also be formed from these silicon-based conductive materials, with many different configurations possible, such as monocrystalline or polycrystalline silicon substrates which are connected by a conductive material fitted at the ends of the other substrates.

The silicon-based conductive material of the present invention can be made into fines and dispersed in a metal or semi-metal bulk or powder, dispersed in various types of resin materials, dispersed in a ceramic or glass material, or dispersed in a mixture of materials selected from among a metal or alloy bulk or powder, a resin material, and a ceramic or glass material.

An easily moldable silicon-based conductive material can be obtained by a method in which a paste is produced by dispersing fines of the silicon-based conductive material of the present invention in a mixture of materials selected from among a metal or alloy bulk or powder, a resin material, and a ceramic or glass material, coating just the surface where conductivity is needed, for example, and patterning, molding, and curing this paste.

The novel silicon-based conductive material of the present invention allows substrates, chips, and the like to be made smaller and increases productivity by implanting phosphorus, boron, aluminum, or the like in a silicon substrate with an ion beam in a pattern so that the required areas become conductive, wherein this silicon-based conductive material can be worked into a sheet or rod and utilized in connector terminals, contacts, and so forth, or can be made into fines and dispersed in a resin or glass to produce a conductive sheet material, for example, and is therefore suitable for any application that requires;electrical conductivity.

Therefore, when polycrystalline Si-TFT is formed on a single glass substrate and various devices such as microprocessors are formed on the surrounding substrate, for example, electrical conduction can be ensured with a silicon-based material, which is a material that forms a film on a glass substrate, so packaging is easier and system integration with a display is possible.

In short, an advantage of the present invention is that, as shown in the above examples, a known means for manufacturing an integrated circuit or the like can be suitably selected and employed, such as disposing a silicon-based material in the form of a paste or particles, disposing a material three-dimensionally such as in the thickness direction of a substrate, forming a film by two-dimensional implantation, or forming films and wiring in various patterns, by subjecting a substrate of silicon alone, or a polycrystalline silicon substrate, to ion beam implantation and patterning so as to obtain the silicon-based material of the present invention, or using a known vapor phase growth method such as vapor deposition, ion sputtering, or ion plating.

Embodiments

Embodiment 1

To produce the conductive material of the present invention, high-purity silicon (10N) and a Group 3 element were compounded as shown in Table 1, after which they were arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured.

Electrical resistivity was determined by measuring the electrical resistance by the four-terminal method at the same time as the carrier concentration. Thermal conductivity was measured at 200° C. by laser flash method. These measurement results are given in Table 1.

Embodiment 2

To produce an n-type silicon thermoelectric semiconductor, high-purity silicon (10N) and a Group 5 element were compounded as shown in Table 2, after which they were arc melted in an argon gas atmosphere. The button-shaped ingots thus obtained:were cut into sizes of 5×5×5 mm, 10×10×2 mm, and 10 mm diameter×2 mm, and the carrier concentration, electrical resistivity, and thermal conductivity of each were measured. These measurement results are given in Table 2.

TABLE 1

| No. | Dopant | Added amount (at %) | Carrier concentration n(M/m$^3$) | Electrical conductivity ρ(Ω · m) | Thermal conductivity κ(W/m · K) |
|---|---|---|---|---|---|
| 1 | B | 0.001 | 3.70 × 10$^{17}$ | 4.1 × 10$^{-4}$ | 97.6 |
| 2 | B | 0.003 | 1.40 × 10$^{18}$ | 1.4 × 10$^{-4}$ | 78.3 |
| 3 | B | 0.01 | 5.20 × 10$^{18}$ | 7.8 × 10$^{-5}$ | 59.2 |
| 4 | B | 0.03 | 1.50 × 10$^{19}$ | 3.3 × 10$^{-5}$ | 43.8 |
| 5 | B | 0.1 | 3.90 × 10$^{19}$ | 1.6 × 10$^{-5}$ | 33.0 |
| 6 | B | 0.3 | 8.20 × 10$^{19}$ | 7.2 × 10$^{-6}$ | 31.0 |
| 7 | B | 1 | 2.30 × 10$^{20}$ | 4.5 × 10$^{-6}$ | 33.0 |
| 8 | Al | 0.001 | 2.96 × 10$^{17}$ | 9.4 × 10$^{-4}$ | 119.3 |
| 9 | Al | 0.003 | 1.12 × 10$^{18}$ | 2.8 × 10$^{-4}$ | 107.3 |
| 10 | Al | 0.01 | 4.16 × 10$^{18}$ | 1.6 × 10$^{-4}$ | 95.4 |
| 11 | Al | 0.03 | 1.20 × 10$^{19}$ | 6.6 × 10$^{-5}$ | 85.8 |
| 12 | Al | 0.1 | 3.12 × 10$^{19}$ | 2.6 × 10$^{-5}$ | 77.1 |
| 13 | Al | 0.3 | 6.56 × 10$^{19}$ | 1.44 × 10$^{-5}$ | 75.0 |
| 14 | Al | 1 | 1.84 × 10$^{20}$ | 9.00 × 10$^{-6}$ | 77.0 |
| 15 | Al | 0.001 | 1.85 × 10$^{17}$ | 1.41 × 10$^{-3}$ | 112.0 |
| 16 | Ga | 0.003 | 7.00 × 10$^{17}$ | 4.2 × 10$^{-4}$ | 94.6 |
| 17 | Ga | 0.01 | 2.60 × 10$^{18}$ | 2.34 × 10$^{-4}$ | 77.6 |
| 18 | Ga | 0.03 | 7.50 × 10$^{18}$ | 9.9 × 10$^{-5}$ | 63.7 |
| 19 | Ga | 0.1 | 1.95 × 10$^{19}$ | 3.9 × 10$^{-5}$ | 51.3 |

TABLE 1-continued

| No. | Dopant | Added amount (at %) | Carrier concentration n(M/m$^3$) | Electrical conductivity ρ(Ω · m) | Thermal conductivity κ(W/m · K) |
|---|---|---|---|---|---|
| 20 | Ga | 0.3 | 4.10 × 10$^{19}$ | 2.16 × 10$^{-5}$ | 45.0 |
| 21 | Ga | 1 | 1.15 × 10$^{20}$ | 1.35 × 10$^{-5}$ | 43.0 |

TABLE 2

| No. | Dopant | Added amount (at %) | Carrier concentration n(M/m$^3$) | Electrical conductivity ρ(Ω · m) | Thermal conductivity κ(W/m · K) |
|---|---|---|---|---|---|
| 22 | P | 0.001 | 4.70 × 10$^{17}$ | 2.4 × 10$^{-4}$ | 98.4 |
| 23 | P | 0.003 | 2.10 × 10$^{18}$ | 9.7 × 10$^{-5}$ | 78.3 |
| 24 | P | 0.01 | 5.90 × 10$^{18}$ | 6.29 × 10$^{-5}$ | 64.5 |
| 25 | P | 0.03 | 1.50 × 10$^{19}$ | 3.3 × 10$^{-5}$ | 52.0 |
| 26 | P | 0.1 | 5.20 × 10$^{19}$ | 1.4 × 10$^{-5}$ | 42.0 |
| 27 | P | 0.3 | 9.20 × 10$^{19}$ | 9.9 × 10$^{-6}$ | 42.0 |
| 28 | P | 1 | 1.60 × 10$^{20}$ | 7.8 × 10$^{-6}$ | 49.0 |
| 29 | Sb | 0.001 | 3.29 × 10$^{17}$ | 4.8 × 10$^{-4}$ | 107.5 |
| 30 | Sb | 0.003 | 1.47 × 10$^{18}$ | 1.94 × 10$^{-4}$ | 89.3 |
| 31 | Sb | 0.01 | 4.13 × 10$^{18}$ | 1.26 × 10$^{-4}$ | 76.8 |
| 32 | Sb | 0.03 | 1.05 × 10$^{19}$ | 6.58 × 10$^{-5}$ | 65.4 |
| 33 | Sb | 0.1 | 3.64 × 10$^{19}$ | 2.8 × 10$^{-5}$ | 52.0 |
| 34 | Sb | 0.3 | 6.44 × 10$^{19}$ | 1.98 × 10$^{-5}$ | 52.0 |
| 35 | Sb | 1 | 1.12 × 10$^{20}$ | 1.56 × 10$^{-5}$ | 57.0 |
| 36 | Bi | 0.001 | 2.35 × 10$^{17}$ | 7.2 × 10$^{-4}$ | 125.3 |
| 37 | Bi | 0.003 | 1.05 × 10$^{18}$ | 2.9 × 10$^{-4}$ | 113.6 |
| 38 | Bi | 0.01 | 2.95 × 10$^{18}$ | 1.89 × 10$^{-4}$ | 105.5 |
| 39 | Bi | 0.03 | 7.50 × 10$^{18}$ | 9.9 × 10$^{-5}$ | 98.2 |
| 40 | Bi | 0.1 | 2.60 × 10$^{19}$ | 4.2 × 10$^{-5}$ | 88.5 |
| 41 | Bi | 0.3 | 4.60 × 10$^{19}$ | 2.97 × 10$^{-5}$ | 87.0 |
| 42 | Bi | 1 | 8.00 × 10$^{19}$ | 2.34 × 10$^{-5}$ | 89.0 |

Embodiment 3

To produce a silicon-based conductive material, high-purity single crystal silicon (10N) and the elements shown in Table 3 were measured out in the specified proportions and then arc melted in an argon gas atmosphere. The button-shaped ingots thus obtained were cut into sizes of 5×5×5 mm, 10×10×2 mm, and 10 mm outside diameter×2 mm, and the carrier concentration, electrical resistivity, and thermal conductivity of each were measured. These measurement results are given in Table 3.

Embodiment 4

To produce a silicon-based conductive material, high-purity single crystal silicon (10N) and the elements shown in Table 4 were measured out in the specified proportions and then arc melted in an argon gas atmosphere. The button-shaped ingots thus obtained were cut into sizes of 5×5×5 mm, 10×10×2 mm, and 10 mm outside diameter×2 mm, and the carrier concentration, electrical resistivity, and thermal conductivity of each were measured. These measurement results are given in Table 4. Nitrogen and oxygen were added by adding $Si_3N_4$ and $SiO_2$ before the arc melting.

Embodiments 3a and 4a

To produce n-type and p-type Si-Ge semiconductors, silicon and polycrystalline germanium (4N) were blended in an atomic ratio of 4:1, the elements shown as Nos. 19, 20, 40, and 41 in Tables 3 and 4 were measured out in the specified proportions, and these components were arc melted in an argon gas atmosphere. After melting, measurement samples were worked into the same shapes as in Embodiments 3 and 4, and the measurement conditions were also the same as in Embodiments 3 and 4.

TABLE 3

| | No | Matrix | Dopant | Added amount (at %) | Carrier concentration (M/m³) | Electrical conductivity p(Ω·m) | Thermal conductivity k(W/mK) |
|---|---|---|---|---|---|---|---|
| Embodiment 3 | 1 | Si | Zn | 0.10 | $1.1 \times 10^{19}$ | $3.67 \times 10^{-4}$ | 52.7 |
| | 2 | Si | Zn | 0.50 | $5.4 \times 10^{19}$ | $1.20 \times 10^{-5}$ | 54.3 |
| | 3 | Si | Zn | 1.0 | $7.3 \times 10^{19}$ | $6.7 \times 10^{-6}$ | 55.3 |
| | 4 | Si | Zn | 3.0 | $1.6 \times 10^{21}$ | $1.77 \times 10^{-6}$ | 57.3 |
| | 5 | Si | Zn | 5.0 | $4.2 \times 10^{21}$ | $2.06 \times 10^{-6}$ | 60 |
| | 6 | Si | Zn | 7.0 | $8.3 \times 10^{21}$ | $4.40 \times 10^{-7}$ | 65.3 |
| | 7 | Si | Cd | 1.0 | $5.3 \times 10^{19}$ | $1.27 \times 10^{-5}$ | 56 |
| | 8 | Si | B | 3.0 | $8.0 \times 10^{20}$ | $2.06 \times 10^{-6}$ | 58.3 |
| | 9 | Si | Al | 0.10 | $5.8 \times 10^{18}$ | $8.33 \times 10^{-5}$ | 52 |
| | 10 | Si | Al | 0.50 | $2.9 \times 10^{19}$ | $1.27 \times 10^{-5}$ | 54 |
| | 11 | Si | Al | 1.0 | $3.3 \times 10^{20}$ | $4.37 \times 10^{-6}$ | 55.7 |
| | 12 | Si | Al | 5.0 | $2.0 \times 10^{21}$ | $3.20 \times 10^{-6}$ | 62 |
| | 13 | Si | Al | 7.0 | $4.8 \times 10^{21}$ | $3.60 \times 10^{-7}$ | 67.3 |
| | 14 | Si | Ga | 3.0 | $6.3 \times 10^{20}$ | $2.80 \times 10^{-6}$ | 61.7 |
| | 15 | Si | In | 3.0 | $4.9 \times 10^{20}$ | $2.36 \times 10^{-6}$ | 60.7 |
| | 16 | Si | Zn Cd | 1.0 1.0 | $1.3 \times 10^{21}$ | $1.20 \times 10^{-6}$ | 57.7 |
| | 17 | Si | Zn Al | 1.0 2.0 | $1.8 \times 10^{21}$ | $3.03 \times 10^{-6}$ | 59.3 |
| | 18 | Si | Al Ga | 1.5 1.5 | $1.0 \times 10^{21}$ | $1.71 \times 10^{-6}$ | 60 |
| 3a | 19 | Si—Ge | Zn | 3.0 | $1.2 \times 10^{21}$ | $6.2 \times 10^{-5}$ | 9.0 |
| | 20 | Si—Ge | Al | 3.0 | $1.1 \times 10^{21}$ | $6.4 \times 10^{-5}$ | 5.6 |

TABLE 4

| | No | Matrix | Dopant | Added amount (at %) | Carrier concentration (M/m³) | Electrical conductivity p(Ω·m) | Thermal conductivity k(W/mK) |
|---|---|---|---|---|---|---|---|
| Embodiment 4 | 21 | Si | P | 0.10 | $4.8 \times 10^{18}$ | $1.35 \times 10^{-4}$ | 51.3 |
| | 22 | Si | P | 0.50 | $3.1 \times 10^{19}$ | $1.42 \times 10^{-5}$ | 55.7 |
| | 23 | Si | P | 1.0 | $7.3 \times 10^{19}$ | $1.12 \times 10^{-5}$ | 58.0 |
| | 24 | Si | P | 3.0 | $2.8 \times 10^{20}$ | $3.20 \times 10^{-6}$ | 61.7 |
| | 25 | Si | P | 5.0 | $1.2 \times 10^{21}$ | $1.83 \times 10^{-6}$ | 64.0 |
| | 26 | Si | P | 10.0 | $3.4 \times 10^{21}$ | $1.10 \times 10^{-6}$ | 68.0 |
| | 27 | Si | P | 15.0 | $7.9 \times 10^{21}$ | $9.40 \times 10^{-7}$ | 77.7 |
| | 28 | Si | Bi | 0.10 | $3.2 \times 10^{18}$ | $1.24 \times 10^{-4}$ | 52.7 |
| | 29 | Si | Bi | 0.50 | $2.4 \times 10^{19}$ | $2.03 \times 10^{-5}$ | 58.0 |
| | 30 | Si | Bi | 3.0 | $1.8 \times 10^{20}$ | $4.84 \times 10^{-6}$ | 61 |
| | 31 | Si | Bi | 10.0 | $1.2 \times 10^{21}$ | $2.03 \times 10^{-6}$ | 67 |
| | 32 | Si | Bi | 15.0 | $3.4 \times 10^{21}$ | $1.20 \times 10^{-6}$ | 74.7 |
| | 33 | Si | N | 3.0 | $1.3 \times 10^{20}$ | $2.95 \times 10^{-6}$ | 62 |
| | 34 | Si | Sb | 3.0 | $2.4 \times 10^{20}$ | $2.34 \times 10^{-6}$ | 63 |
| | 35 | Si | Bi | 3.0 | $2.7 \times 10^{20}$ | $2.18 \times 10^{-6}$ | 60.7 |
| | 36 | Si | O | 3.0 | $1.2 \times 10^{20}$ | $5.42 \times 10^{-6}$ | 58 |
| | 37 | Si | S | 3.0 | $2.6 \times 10^{20}$ | $3.04 \times 10^{-6}$ | 61.7 |
| | 38 | Si | P Sb | 1.5 1.5 | $2.7 \times 10^{20}$ | $2.82 \times 10^{-6}$ | 63 |
| | 39 | Si | P Bi | 1.0 2.0 | $2.4 \times 10^{20}$ | $3.56 \times 10^{-6}$ | 59.3 |
| 4a | 40 | Si—Ge | P | 3.0 | $2.3 \times 10^{20}$ | $2.05 \times 10^{-5}$ | 5.2 |
| | 41 | Si—Ge | Bi | 3.0 | $1.4 \times 10^{20}$ | $3.41 \times 10^{-5}$ | 9.0 |

Embodiment 5

To produce a silicon-based conductive material, high-purity single crystal silicon (10N) and Group 3 and 5 elements were compounded as shown in Table 5-1, after which they were arc melted in an argon gas atmosphere. The added amounts in the melting were adjusted such that there was slightly more p-type element so that the p-type carrier concentration would be $10^{19}$ to $10^{20}$ (M/m³).

The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Table 5-2.

Embodiment 6

To produce a silicon-based conductive material, high-purity single crystal silicon (10N) and Group 3 and 5 elements were compounded as shown in Table 6-1, after which they were arc melted in an argon gas atmosphere. The added amounts in the melting were adjusted such that there was slightly more n-type element so that the n-type carrier concentration would be $10^{19}$ to $10^{20}$ (M/m$^3$).

The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Table 6-2.

Embodiment 7

To produce a silicon-based conductive material, a 2–6 compound semiconductor or a 3–5 compound semiconductor, high-purity single crystal silicon (1OON), and a Group 3 or 5 element were compounded as shown in Table 7-1, after which they were arc melted in an argon gas atmosphere. The added amount of the Group 3 or 5 element in the melting were adjusted such that the p-type and n-type carrier concentrations would be $10^{19}$ to $10^{20}$ (M/m$^3$).

The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Table 7-2.

TABLE 5-1

Embodiment 5

| | | Dopant | | Dopant | |
|---|---|---|---|---|---|
| No | Matrix | Element name | Added amount (at %) | Element name | Added amount (at %) |
| 1 | Si | B | 2.2 | P | 2.0 |
| 2 | Si | B | 3.0 | P | 2.0 |
| 3 | Si | B | 5.0 | P | 2.0 |
| 4 | Si | B | 8.0 | P | 2.0 |
| 5 | Si | B | 3.2 | Sb | 3.0 |
| 6 | Si | B | 4.0 | Sb | 3.0 |
| 7 | Si | B | 6.0 | Sb | 3.0 |
| 8 | Si | B | 9.0 | Sb | 3.0 |
| 9 | Si | Al | 2.2 | P | 2.0 |
| 10 | Si | Al | 3.0 | P | 2.0 |
| 11 | Si | Al | 5.0 | P | 2.0 |
| 12 | Si | Al | 8.0 | P | 2.0 |
| 13 | Si | Al | 3.2 | Bi | 3.0 |
| 14 | Si | Al | 4.0 | Bi | 3.0 |
| 15 | Si | Al | 6.0 | Bi | 3.0 |
| 16 | Si | Al | 9.0 | Bi | 3.0 |
| 17 | Si | Ga | 2.2 | P | 2.0 |
| 18 | Si | Ga | 3.0 | P | 2.0 |
| 19 | Si | Ga | 5.0 | P | 2.0 |
| 20 | Si | Ga | 8.0 | P | 2.0 |
| 21 | Si | Ga | 3.2 | Sb | 3.0 |
| 22 | Si | Ga | 4.0 | Sb | 3.0 |
| 23 | Si | Ga | 6.0 | Sb | 3.0 |
| 24 | Si | Ga | 9.0 | Sb | 3.0 |
| 25 | Si | In | 2.2 | P | 2.0 |
| 26 | Si | In | 3.0 | P | 2.0 |
| 27 | Si | In | 5.0 | P | 2.0 |
| 28 | Si | In | 8.0 | P | 2.0 |

TABLE 5-2

Embodiment 5

| | Characteristics | | |
|---|---|---|---|
| No | Carrier concentration n(M/m$^3$) | Electrical conductivity ρ(Ω · m) | Thermal conductivity κ(W/m · K) |
| 1 | 5.20 × 10$^{+18}$ | 7.80 × 10$^{-3}$ | 25 |
| 2 | 1.02 × 10$^{+19}$ | 3.60 × 10$^{-5}$ | 19 |
| 3 | 7.30 × 10$^{+20}$ | 6.90 × 10$^{-6}$ | 15 |
| 4 | 2.70 × 10$^{+21}$ | 2.40 × 10$^{-6}$ | 13 |
| 5 | 4.20 × 10$^{+18}$ | 7.60 × 10$^{-3}$ | 33 |
| 6 | 6.80 × 10$^{+19}$ | 4.10 × 10$^{-5}$ | 24 |
| 7 | 5.90 × 10$^{+20}$ | 7.80 × 10$^{-6}$ | 18 |
| 8 | 1.80 × 10$^{+21}$ | 3.40 × 10$^{-6}$ | 15 |
| 9 | 3.30 × 10$^{+18}$ | 8.50 × 10$^{-3}$ | 28 |
| 10 | 7.80 × 10$^{+19}$ | 6.30 × 10$^{-5}$ | 20 |
| 11 | 3.80 × 10$^{+20}$ | 2.10 × 10$^{-5}$ | 18 |
| 12 | 1.40 × 10$^{+21}$ | 7.80 × 10$^{-6}$ | 16 |
| 13 | 2.10 × 10$^{+18}$ | 8.20 × 10$^{-3}$ | 41 |
| 14 | 6.70 × 10$^{+19}$ | 5.90 × 10$^{-5}$ | 26 |
| 15 | 3.60 × 10$^{+20}$ | 1.80 × 10$^{-5}$ | 24 |
| 16 | 1.30 × 10$^{+21}$ | 7.20 × 10$^{-6}$ | 22 |
| 17 | 2.30 × 10$^{+18}$ | 9.80 × 10$^{-3}$ | 21 |
| 18 | 5.20 × 10$^{+19}$ | 7.20 × 10$^{-5}$ | 17 |
| 19 | 3.70 × 10$^{+20}$ | 3.60 × 10$^{-5}$ | 13 |
| 20 | 1.90 × 10$^{+21}$ | 9.30 × 10$^{-6}$ | 11 |
| 21 | 2.60 × 10$^{+18}$ | 9.20 × 10$^{-3}$ | 26 |
| 22 | 4.30 × 10$^{+19}$ | 6.80 × 10$^{-5}$ | 20 |
| 23 | 3.80 × 10$^{+20}$ | 3.20 × 10$^{-5}$ | 16 |
| 24 | 1.20 × 10$^{+21}$ | 8.90 × 10$^{-6}$ | 13 |
| 25 | 3.70 × 10$^{+18}$ | 9.40 × 10$^{-3}$ | 23 |
| 26 | 6.80 × 10$^{+19}$ | 6.70 × 10$^{-5}$ | 18 |
| 27 | 4.70 × 10$^{+20}$ | 2.90 × 10$^{-5}$ | 15 |
| 28 | 1.60 × 10$^{+21}$ | 7.70 × 10$^{-6}$ | 13 |

TABLE 6-1

Embodiment 6

| | | Dopant | | Dopant | |
|---|---|---|---|---|---|
| No | Matrix | Element name | Added amount (at %) | Element name | Added amount (at %) |
| 31 | Si | B | 2.0 | P | 2.2 |
| 32 | Si | B | 2.0 | P | 3.0 |
| 33 | Si | B | 2.0 | P | 8.0 |
| 34 | Si | B | 2.0 | P | 13.0 |
| 35 | Si | B | 3.0 | Sb | 3.2 |
| 36 | Si | B | 3.0 | Sb | 4.0 |
| 37 | Si | B | 3.0 | Sb | 9.0 |
| 38 | Si | B | 3.0 | Sb | 14.0 |
| 39 | Si | Al | 2.0 | P | 2.2 |
| 40 | Si | Al | 2.0 | P | 3.0 |
| 41 | Si | Al | 2.0 | P | 8.0 |
| 42 | Si | Al | 2.0 | P | 13.0 |
| 43 | Si | Al | 3.0 | Bi | 3.2 |
| 44 | Si | Al | 3.0 | Bi | 4.0 |
| 45 | Si | Al | 3.0 | Bi | 9.0 |
| 46 | Si | Al | 3.0 | Bi | 14.0 |
| 47 | Si | Ga | 2.0 | P | 2.2 |
| 48 | Si | Ga | 2.0 | P | 3.0 |
| 49 | Si | Ga | 2.0 | P | 8.0 |
| 50 | Si | Ga | 2.0 | P | 13.0 |
| 51 | Si | Ga | 3.0 | Sb | 3.2 |
| 52 | Si | Ga | 3.0 | Sb | 4.0 |
| 53 | Si | Ga | 3.0 | Sb | 9.0 |
| 54 | Si | Ga | 3.0 | Sb | 14.0 |
| 55 | Si | In | 2.0 | P | 2.2 |
| 56 | Si | In | 2.0 | P | 3.0 |
| 57 | Si | In | 2.0 | P | 8.0 |
| 58 | Si | In | 2.0 | P | 13.0 |

TABLE 6-2

Embodiment 6

| No | Carrier concentration $n(M/m^3)$ | Characteristics Electrical conductivity $\rho(\Omega \cdot m)$ | Thermal conductivity $\kappa(W/m \cdot K)$ |
|---|---|---|---|
| 31 | $4.30 \times 10^{+18}$ | $7.20 \times 10^{-3}$ | 48 |
| 32 | $3.70 \times 10^{+19}$ | $3.60 \times 10^{-5}$ | 24 |
| 33 | $5.70 \times 10^{+20}$ | $9.60 \times 10^{-6}$ | 15 |
| 34 | $1.80 \times 10^{+21}$ | $5.20 \times 10^{-6}$ | 13 |
| 35 | $3.50 \times 10^{+18}$ | $8.40 \times 10^{-3}$ | 52 |
| 36 | $3.20 \times 10^{+19}$ | $4.20 \times 10^{-5}$ | 36 |
| 37 | $5.20 \times 10^{+20}$ | $1.04 \times 10^{-5}$ | 24 |
| 38 | $1.60 \times 10^{+21}$ | $5.80 \times 10^{-6}$ | 21 |
| 39 | $3.60 \times 10^{+18}$ | $5.60 \times 10^{-3}$ | 51 |
| 40 | $3.40 \times 10^{+19}$ | $4.20 \times 10^{-5}$ | 27 |
| 41 | $4.40 \times 10^{+20}$ | $9.80 \times 10^{-6}$ | 19 |
| 42 | $1.20 \times 10^{+21}$ | $5.60 \times 10^{-6}$ | 14 |
| 43 | $2.90 \times 10^{+18}$ | $8.40 \times 10^{-3}$ | 59 |
| 44 | $3.10 \times 10^{+19}$ | $4.60 \times 10^{-5}$ | 41 |
| 45 | $3.70 \times 10^{+20}$ | $1.04 \times 10^{-5}$ | 28 |
| 46 | $1.10 \times 10^{+21}$ | $5.60 \times 10^{-6}$ | 24 |
| 47 | $3.80 \times 10^{+18}$ | $7.40 \times 10^{-3}$ | 33 |
| 48 | $3.60 \times 10^{+19}$ | $4.00 \times 10^{-5}$ | 19 |
| 49 | $4.70 \times 10^{+20}$ | $1.02 \times 10^{-5}$ | 10 |
| 50 | $1.40 \times 10^{+21}$ | $5.40 \times 10^{-6}$ | 7 |
| 51 | $3.60 \times 10^{+18}$ | $8.60 \times 10^{-3}$ | 36 |
| 52 | $3.40 \times 10^{+19}$ | $5.20 \times 10^{-5}$ | 26 |
| 53 | $4.10 \times 10^{+20}$ | $1.10 \times 10^{-5}$ | 20 |
| 54 | $1.30 \times 10^{+21}$ | $6.40 \times 10^{-6}$ | 15 |
| 55 | $4.20 \times 10^{+18}$ | $7.20 \times 10^{-3}$ | 44 |
| 56 | $3.90 \times 10^{+19}$ | $3.80 \times 10^{-5}$ | 23 |
| 57 | $6.90 \times 10^{+20}$ | $9.80 \times 10^{-6}$ | 16 |
| 58 | $2.00 \times 10^{+21}$ | $5.00 \times 10^{-6}$ | 13 |

TABLE 7-1

Embodiment 7

| No | Matrix | Dopant Element name | Added amount (at %) | Dopant Element name | Added amount (at %) |
|---|---|---|---|---|---|
| 61 | Si | AlP | 1.0 | B | 1.0 |
| 62 | Si | AlP | 3.0 | B | 1.0 |
| 63 | Si | AlP | 10.0 | B | 1.0 |
| 64 | Si | AlP | 1.0 | P | 1.0 |
| 65 | Si | AlP | 3.0 | P | 1.0 |
| 66 | Si | AlP | 10.0 | P | 1.0 |
| 67 | Si | GaP | 1.0 | B | 1.0 |
| 68 | Si | GaP | 3.0 | B | 1.0 |
| 69 | Si | GaP | 10.0 | B | 1.0 |
| 70 | Si | GaP | 1.0 | As | 1.0 |
| 71 | Si | GaP | 3.0 | As | 1.0 |
| 72 | Si | GaP | 10.0 | As | 1.0 |
| 73 | Si | GaAs | 1.0 | Al | 1.0 |
| 74 | Si | GaAs | 3.0 | Al | 1.0 |
| 75 | Si | GaAs | 10.0 | Al | 1.0 |
| 76 | Si | GaAs | 1.0 | P | 1.0 |
| 77 | Si | GaAs | 3.0 | P | 1.0 |
| 78 | Si | GaAs | 10.0 | P | 1.0 |
| 79 | Si | ZnO | 1.0 | B | 1.0 |
| 80 | Si | ZnO | 3.0 | B | 1.0 |
| 81 | Si | ZnO | 10.0 | B | 1.0 |
| 82 | Si | ZnO | 1.0 | P | 1.0 |
| 83 | Si | ZnO | 3.0 | P | 1.0 |
| 84 | Si | ZnO | 10.0 | P | 1.0 |
| 85 | Si | CdS | 1.0 | B | 1.0 |
| 86 | Si | CdS | 3.0 | B | 1.0 |
| 87 | Si | CdS | 10.0 | B | 1.0 |
| 88 | Si | CdS | 1.0 | Sb | 1.0 |
| 89 | Si | CdS | 3.0 | Sb | 1.0 |
| 90 | Si | CdS | 10.0 | Sb | 1.0 |

TABLE 7-2

Embodiment 7

| No | Carrier concentration $n(M/m^3)$ | Electrical conductivity $\rho(\Omega \cdot m)$ | Thermal conductivity $\kappa(W/m \cdot K)$ |
|---|---|---|---|
| 61 | $4.50 \times 10^{+20}$ | $6.40 \times 10^{-6}$ | 109 |
| 62 | $4.20 \times 10^{+20}$ | $7.20 \times 10^{-6}$ | 19 |
| 63 | $4.10 \times 10^{+20}$ | $7.40 \times 10^{-6}$ | 15 |
| 64 | $5.30 \times 10^{+20}$ | $9.00 \times 10^{-6}$ | 102 |
| 65 | $5.10 \times 10^{+20}$ | $9.20 \times 10^{-6}$ | 20 |
| 66 | $4.90 \times 10^{+20}$ | $9.40 \times 10^{-6}$ | 16 |
| 67 | $4.80 \times 10^{+20}$ | $7.00 \times 10^{-6}$ | 107 |
| 68 | $4.60 \times 10^{+20}$ | $7.40 \times 10^{-6}$ | 16 |
| 69 | $4.40 \times 10^{+20}$ | $7.60 \times 10^{-6}$ | 13 |
| 70 | $4.70 \times 10^{+20}$ | $1.06 \times 10^{-5}$ | 108 |
| 71 | $4.40 \times 10^{+20}$ | $1.12 \times 10^{-5}$ | 18 |
| 72 | $4.30 \times 10^{+20}$ | $1.12 \times 10^{-5}$ | 14 |
| 73 | $3.90 \times 10^{+20}$ | $1.24 \times 10^{-5}$ | 92 |
| 74 | $3.70 \times 10^{+20}$ | $1.34 \times 10^{-5}$ | 17 |
| 75 | $3.80 \times 10^{+20}$ | $1.32 \times 10^{-5}$ | 13 |
| 76 | $4.90 \times 10^{+20}$ | $8.80 \times 10^{-6}$ | 103 |
| 77 | $4.70 \times 10^{+20}$ | $9.20 \times 10^{-6}$ | 18 |
| 78 | $5.00 \times 10^{+20}$ | $9.40 \times 10^{-6}$ | 15 |
| 79 | $4.70 \times 10^{+20}$ | $7.40 \times 10^{-6}$ | 105 |
| 80 | $4.30 \times 10^{+20}$ | $7.60 \times 10^{-6}$ | 16 |
| 81 | $4.40 \times 10^{+20}$ | $7.80 \times 10^{-6}$ | 11 |
| 82 | $4.30 \times 10^{+20}$ | $1.00 \times 10^{-5}$ | 107 |
| 83 | $4.30 \times 10^{+20}$ | $1.04 \times 10^{-5}$ | 17 |
| 84 | $4.10 \times 10^{+20}$ | $1.06 \times 10^{-5}$ | 13 |
| 85 | $4.50 \times 10^{+20}$ | $7.20 \times 10^{-6}$ | 107 |
| 86 | $4.10 \times 10^{+20}$ | $7.40 \times 10^{-6}$ | 18 |
| 87 | $4.20 \times 10^{+20}$ | $7.40 \times 10^{-6}$ | 14 |
| 88 | $3.70 \times 10^{+20}$ | $1.16 \times 10^{-5}$ | 109 |
| 89 | $3.80 \times 10^{+20}$ | $1.18 \times 10^{-5}$ | 15 |
| 90 | $3.40 \times 10^{+20}$ | $1.20 \times 10^{-5}$ | 13 |

Embodiment 8

To produce a silicon-based conductive material, high-purity silicon (10N) and Group 3 and 4 elements were compounded as shown in Table 8-1, after which they were arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Table 8-2.

Embodiment 9

To produce a silicon-based conductive material, high-purity silicon (10ON) and Group 5 and 4 elements were compounded as shown in Table 9-1, after which they were arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Table 9-2.

TABLE 8-1

| No | Matrix | Dopant Element name | Dopant Added amount (at %) | Dopant Element name | Dopant Added amount (at %) |
|---|---|---|---|---|---|
| 1 | Si | C | 0.05 | B | 1.0 |
| 2 | Si | C | 3.0 | B | 1.0 |
| 3 | Si | C | 5.0 | B | 1.0 |
| 4 | 5i | Ge | 0.05 | B | 1.0 |
| 5 | Si | Ge | 3.0 | B | 1.0 |
| 6 | Si | Ge | 5.0 | B | 1.0 |
| 7 | Si | Sn | 0.05 | Al | 1.0 |
| 8 | Si | Sn | 3.0 | Al | 1.0 |
| 9 | Si | Sn | 5.0 | Al | 1.0 |
| 10 | Si | B | 3.0 | — | — |
| 11 | Si | Ga | 3.0 | — | — |
| 12 | Si—Ge | Ge | 20.0 | B | 3 0 |
| 13 | Si—Ge | Ge | 20.0 | Ga | 3.0 |

TABLE 8-2

| No | Carrier concentration n(M/m³) | Electrical conductivity ρ(Ω · m) | Thermal conductivity κ(W/m · K) |
|---|---|---|---|
| 1 | $3.20 \times 10^{+20}$ | $5.40 \times 10^{-6}$ | 92 |
| 2 | $3.10 \times 10^{+20}$ | $5.80 \times 10^{-6}$ | 22 |
| 3 | $3.05 \times 10^{+20}$ | $5.90 \times 10^{-6}$ | 18 |
| 4 | $3.40 \times 10^{+20}$ | $5.70 \times 10^{-6}$ | 83 |
| 5 | $3.30 \times 10^{+20}$ | $5.90 \times 10^{-6}$ | 18 |
| 6 | $3.20 \times 10^{+20}$ | $6.10 \times 10^{-6}$ | 15 |
| 7 | $2.50 \times 10^{+20}$ | $7.60 \times 10^{-6}$ | 86 |
| 8 | $2.60 \times 10^{+20}$ | $7.80 \times 10^{-5}$ | 20 |
| 9 | $2.40 \times 10^{+20}$ | $7.90 \times 10^{-5}$ | 16 |
| 10 | $4.50 \times 10^{+20}$ | $5.30 \times 10^{-6}$ | 32 |
| 11 | $3.70 \times 10^{+20}$ | $6.70 \times 10^{-6}$ | 36 |
| 12 | $4.50 \times 10^{+19}$ | $2.80 \times 10^{-4}$ | 15 |
| 13 | $3.70 \times 10^{+19}$ | $3.40 \times 10^{-4}$ | 9 |

TABLE 9-1

| No | Matrix | Dopant Element name | Dopant Added amount (at %) | Dopant Element name | Dopant Added amount (at %) |
|---|---|---|---|---|---|
| 21 | Si | C | 0.05 | P | 1.0 |
| 22 | Si | C | 3.0 | P | 1.0 |
| 23 | Si | C | 5.0 | P | 1.0 |
| 24 | Si | Ge | 0.05 | Sb | 1.0 |
| 25 | Si | Ge | 3.0 | Sb | 1.0 |
| 26 | Si | Ge | 5.0 | Sb | 1.0 |
| 27 | Si | Sn | 0.05 | P | 1.0 |
| 28 | Si | Sn | 3.0 | P | 1.0 |
| 29 | Si | Sn | 5.0 | P | 1.0 |
| 30 | Si | P | 3.0 | — | — |
| 31 | Si | Bi | 3.0 | — | — |
| 32 | Si—Ge | Ge | 20.0 | P | 3.0 |
| 33 | Si—Ge | Ge | 20.0 | Ga | 3.0 |

TABLE 9-2

| No. | Carrier concentration n(M/m³) | Electrical conductivity ρ(Ω · m) | Thermal conductivity κ(W/m · K) |
|---|---|---|---|
| 21 | $4.30 \times 10^{+20}$ | $6.70 \times 10^{-6}$ | 102 |
| 22 | $4.10 \times 10^{+20}$ | $6.80 \times 10^{-6}$ | 25 |
| 23 | $4.05 \times 10^{+20}$ | $7.00 \times 10^{-6}$ | 18 |
| 24 | $3.50 \times 10^{+20}$ | $7.30 \times 10^{-6}$ | 97 |
| 25 | $3.40 \times 10^{+20}$ | $7.50 \times 10^{-6}$ | 22 |
| 26 | $3.30 \times 10^{+20}$ | $7.70 \times 10^{-6}$ | 15 |
| 27 | $3.10 \times 10^{+20}$ | $6.80 \times 10^{-6}$ | 99 |
| 28 | $2.90 \times 10^{+20}$ | $7.10 \times 10^{-6}$ | 23 |
| 29 | $2.80 \times 10^{+20}$ | $7.20 \times 10^{-6}$ | 18 |
| 30 | $1.02 \times 10^{+20}$ | $6.80 \times 10^{-6}$ | 52 |
| 31 | $9.70 \times 10^{+19}$ | $7.40 \times 10^{-6}$ | 78 |
| 32 | $1.02 \times 10^{+20}$ | $3.80 \times 10^{-4}$ | 8 |
| 33 | $9.70 \times 10^{+19}$ | $2.60 \times 10^{-4}$ | 13 |

Embodiment 10

To produce a p-type silicon semiconductor, high-purity single crystal silicon (10N) and the elements shown in Table 10 were measured out in the specified proportions and then arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Table 10.

Embodiment 11

To produce an n-type silicon semiconductor, high-purity single crystal silicon (10N) and the elements shown in Table 11-1 were measured out in the specified proportions and then arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in-Tables 11-1 and 11-2.

TABLE 10

| | No | Matrix | Dopant | Added amount (at %) | Carrier concentration (M/m³) | Electrical conductivity p(Ω · m) | Thermal conductivity k(W/mK) |
|---|---|---|---|---|---|---|---|
| Embodiment 10 | 1 | Si | Y | 0.10 | $1.7 \times 10^{19}$ | $8.4 \times 10^{-4}$ | 62 |
| | 2 | Si | Y | 0.50 | $8.1 \times 10^{19}$ | $3.6 \times 10^{-5}$ | 57 |
| | 3 | Si | Y | 1.0 | $1.1 \times 10^{20}$ | $2.1 \times 10^{-5}$ | 47 |
| | 4 | Si | Y | 5.0 | $2.4 \times 10^{21}$ | $6.6 \times 10^{-6}$ | 33 |

TABLE 10-continued

| | | Dopant and added amount | | | Characteristics | |
|---|---|---|---|---|---|---|
| No | Matrix | Dopant | Added amount (at %) | Carrier concentration ($M/m^3$) | Electrical conductivity $\rho(\Omega \cdot m)$ | Thermal conductivity $k(W/mK)$ |
| 5 | Si | Y | 10.0 | $6.3 \times 10^{21}$ | $3.8 \times 10^{-6}$ | 26 |
| 6 | Si | Y | 15.0 | $1.2 \times 10^{22}$ | $1.6 \times 10^{-6}$ | 19 |
| 7 | Si | Mo | 0.10 | $2.4 \times 10^{19}$ | $3.2 \times 10^{-4}$ | 63 |
| 8 | Si | Mo | 0.50 | $1.1 \times 10^{20}$ | $1.8 \times 10^{-5}$ | 48 |
| 9 | Si | Mo | 5.0 | $1.2 \times 10^{21}$ | $5.1 \times 10^{-6}$ | 28 |
| 10 | Si | Mo | 10.0 | $2.2 \times 10^{21}$ | $3.2 \times 10^{-6}$ | 22 |
| 11 | Si | Mo | 15.0 | $3.4 \times 10^{21}$ | $1.8 \times 10^{-6}$ | 18 |
| 12 | Si | Y<br>Mo | 1.5<br>1.5 | $2.4 \times 10^{20}$ | $1.1 \times 10^{-5}$ | 38 |
| 13 | Si | Zr | 5.0 | $1.6 \times 10^{20}$ | $4.0 \times 10^{-6}$ | 27 |

TABLE 11-1

| | | | Dopant and added amount | | | Characteristics | |
|---|---|---|---|---|---|---|---|
| | No | Matrix | Dopant | Added amount (at %) | Carrier concentration ($M/m^3$) | Electrical conductivity $\rho(\Omega \cdot m)$ | Thermal conductivity $k(W/mK)$ |
| Embodiment 11 | 14 | Si | Nd | 0.10 | $1.8 \times 10^{19}$ | $3.5 \times 10^{-4}$ | 112 |
| | 15 | Si | Nd | 0.50 | $7.5 \times 10^{18}$ | $3.2 \times 10^{-5}$ | 98 |
| | 16 | Si | Nd | 1.0 | $1.2 \times 10^{20}$ | $1.7 \times 10^{-5}$ | 72 |
| | 17 | Si | Nd | 5.0 | $5.3 \times 10^{20}$ | $6.0 \times 10^{-6}$ | 48 |
| | 18 | Si | Nd | 10.0 | $1.3 \times 10^{21}$ | $3.0 \times 10^{-6}$ | 35 |
| | 19 | Si | Nd | 15.0 | $2.8 \times 10^{21}$ | $8.3 \times 10^{-7}$ | 25 |
| | 20 | Si | Fe | 0.10 | $1.3 \times 10^{19}$ | $4.3 \times 10^{-4}$ | 134 |
| | 21 | Si | Fe | 0.50 | $3.4 \times 10^{19}$ | $2.1 \times 10^{-5}$ | 105 |
| | 22 | Si | Fe | 3.0 | $1.8 \times 10^{20}$ | $6.2 \times 10^{-6}$ | 74 |
| | 23 | Si | Fe | 10.0 | $8.3 \times 10^{20}$ | $3.4 \times 10^{-6}$ | 55 |
| | 24 | Si | Fe | 15.0 | $1.7 \times 10^{21}$ | $1.5 \times 10^{-6}$ | 42 |
| | 25 | Si | La | 3.0 | $3.4 \times 10^{20}$ | $6.8 \times 10^{-6}$ | 54 |
| | 26 | Si | Ce | 3.0 | $3.1 \times 10^{20}$ | $6.4 \times 10^{-6}$ | 54 |
| | 27 | Si | Pr | 3.0 | $3.5 \times 10^{20}$ | $6.5 \times 10^{-6}$ | 52 |
| | 28 | Si | Sm | 3.0 | $2.5 \times 10^{20}$ | $6.6 \times 10^{-6}$ | 52 |
| | 29 | Si | Dy | 3.0 | $3.7 \times 10^{20}$ | $6.2 \times 10^{-6}$ | 51 |
| | 30 | Si | Ti | 3.0 | $3.2 \times 10^{20}$ | $3.2 \times 10^{-6}$ | 83 |
| | 31 | Si | V | 3.0 | $3.6 \times 10^{20}$ | $7.7 \times 10^{-6}$ | 80 |
| | 32 | Si | Cr | 3.0 | $1.8 \times 10^{20}$ | $8.4 \times 10^{-6}$ | 77 |
| | 33 | Si | Mn | 3.0 | $1.4 \times 10^{20}$ | $8.7 \times 10^{-6}$ | 76 |

TABLE 11-2

| | | | Dopant and added amount | | | Thermoelectric characteristics | |
|---|---|---|---|---|---|---|---|
| | No | Matrix | Dopant | Added amount (at %) | Carrier concentration ($M/m^3$) | Electrical conductivity $\rho(\Omega \cdot m)$ | Thermal conductivity $k(W/mK)$ |
| Embodiment 11 | 34 | Si | Co | 3.0 | $1.6 \times 10^{20}$ | $3.4 \times 10^{-6}$ | 74 |
| | 35 | Si | Ni | 3.0 | $1.3 \times 10^{20}$ | $6.9 \times 10^{-6}$ | 72 |
| | 36 | Si | Cu | 3.0 | $1.4 \times 10^{20}$ | $7.3 \times 10^{-6}$ | 71 |
| | 37 | Si | Nb | 3.0 | $2.6 \times 10^{20}$ | $3.7 \times 10^{-6}$ | 63 |
| | 38 | Si | Ag | 3.0 | $2.8 \times 10^{20}$ | $6.0 \times 10^{-6}$ | 60 |
| | 39 | Si | Ce<br>Nd | 1.0<br>2.0 | $3.3 \times 10^{20}$ | $5.9 \times 10^{-6}$ | 58 |
| | 40 | Si | Dy<br>Zr | 1.0<br>2.0 | $3.1 \times 10^{20}$ | $6.7 \times 10^{-6}$ | 58 |
| | 41 | Si | Nd<br>Nb<br>Fe | 1.0<br>2.0<br>1.0 | $2.2 \times 10^{20}$ | $5.6 \times 10^{-6}$ | 63 |
| | 42 | Si | La<br>Dy<br>Nb | 1.0<br>2.0<br>1.0 | $2.6 \times 10^{20}$ | $6.9 \times 10^{-6}$ | 56 |

TABLE 11-2-continued

| | | Dopant and added amount | | Thermoelectric characteristics | |
|---|---|---|---|---|---|
| No | Matrix | Dopant | Added amount (at %) | Carrier concentration (M/m$^3$) | Electrical conductivity $\rho(\Omega \cdot m)$ | Thermal conductivity k(W/mK) |
| 43 | Si | La | 1.0 | $1.8 \times 10^{20}$ | $9.2 \times 10^{-6}$ | 60 |
|    |    | Fe | 2.0 | | | |
|    |    | Ni | 1.0 | | | |

Embodiment 12

To produce a p-type silicon semiconductor, high-purity single crystal silicon (10N) and the elements shown in Table 12-1 were measured out in the specified proportions and then arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Tables 12-1 and 12-2.

Embodiment 13

To produce an n-type silicon semiconductor, high-purity single crystal silicon (10N) and the elements shown in Table 13-1 were measured out in the specified proportions and then arc melted in an argon gas atmosphere. The button-shaped ingots thus obtained were cut into sizes of 5×5×5 mm, 10×10×2 mm, and 10 mm diameter×2 mm, and the carrier concentration, electrical resistivity, and thermal conductivity of each were measured. These measurement results are given in Tables 13-1 and 13-2. Nitrogen and oxygen were added by adding Si$_3$N$_4$ and SiO$_2$ during arc melting.

Embodiments 12a and 13a

To produce n-type and p-type Si-Ge semiconductors, silicon and polycrystalline germanium (4N) were blended in an atomic ratio of 4:1, the elements shown as Nos. 29, 30, 59, and 60 in Tables 14-1 and 15-1 were measured out in the specified proportions, and then arc melted in an argon gas atmosphere. After melting, measurement samples were worked into the same shapes as in Embodiment 12, and the measurement conditions were the same as in Embodiment 1.

TABLE 12-1

| | | Dopant | | Dopant | |
|---|---|---|---|---|---|
| No | Matrix | Element name | Added amount (at %) | Element name | Added amount (at %) |
| Embodiment 12 | | | | | |
| 1 | Si | Al | 0.1 | Y | 0.1 |
| 2 | Si | Al | 0.3 | Y | 0.2 |
| 3 | Si | Al | 1.5 | Y | 1.5 |
| 4 | Si | Al | 4 | Y | 2 |
| 5 | Si | Al | 8 | Y | 3 |
| 6 | Si | Al | 1.5 | Mo | 1.5 |
| 7 | Si | Al | 0.1 | Zr | 0.1 |
| 8 | Si | Al | 0.3 | Zr | 0.2 |
| 9 | Si | Al | 1.5 | Zr | 1.5 |
| 10 | Si | Al | 3 | Zr | 2 |
| 11 | Si | Al | 8 | Zr | 3 |
| 12 | Si | Al | 0.1 | La | 0.1 |
| 13 | Si | Al | 0.3 | La | 0.2 |
| 14 | Si | Al | 1.5 | La | 1.5 |
| 15 | Si | Al | 3 | La | 2 |
| 16 | Si | Al | 8 | La | 3 |
| 17 | Si | Al | 1.5 | Ce | 1.5 |
| 18 | Si | Al | 1.5 | Pr | 1.5 |
| 19 | Si | Al | 1.5 | Nd | 1.5 |
| 20 | Si | Al | 1.5 | Sm | 1.5 |
| 21 | Si | Al | 1.5 | Dy | 1.5 |
| 22 | Si | Ga | 0.1 | Zr | 0.1 |
| 23 | Si | Ga | 0.3 | Zr | 0.2 |
| 24 | Si | Ga | 1.5 | Zr | 1.5 |
| 25 | Si | Ga | 3 | Zr | 2 |
| 26 | Si | Ga | 8 | Zr | 3 |
| 27 | Si | In | 1.5 | Zr | 1.5 |
| 28 | Si | Be | 1.5 | Zr | 1.5 |
| 12a | | | | | |
| 29 | Si—Ge | Al | 3 | | |
| 30 | Si—Ge | Ga | 3 | | |

TABLE 12-2

| | Characteristics | | |
|---|---|---|---|
| No. | Carrier concentration n(M/m$^3$) | Electrical conductivity $\rho(\Omega \cdot m)$ | Thermal conductivity $\kappa$(W/m · K) |
| Embodiment 12 | | | |
| 1 | $4.30 \times 10^{17}$ | $7.80 \times 10^{-4}$ | 106 |
| 2 | $1.02 \times 10^{19}$ | $7.20 \times 10^{-6}$ | 89 |
| 3 | $5.60 \times 10^{19}$ | $5.40 \times 10^{-6}$ | 78 |
| 4 | $7.30 \times 10^{20}$ | $1.10 \times 10^{-6}$ | 65 |
| 5 | $2.60 \times 10^{21}$ | $7.60 \times 10^{-7}$ | 59 |
| 6 | $6.80 \times 10^{19}$ | $6.20 \times 10^{-6}$ | 64 |
| 7 | $6.20 \times 10^{17}$ | $4.80 \times 10^{-5}$ | 95 |
| 8 | $2.10 \times 10^{19}$ | $6.90 \times 10^{-6}$ | 79 |
| 9 | $5.70 \times 10^{20}$ | $4.90 \times 10^{-6}$ | 72 |
| 10 | $6.40 \times 10^{20}$ | $1.30 \times 10^{-6}$ | 66 |
| 11 | $1.90 \times 10^{21}$ | $7.60 \times 10^{-7}$ | 61 |
| 12 | $6.30 \times 10^{18}$ | $1.4 \times 10^{-4}$ | 67 |
| 13 | $3.10 \times 10^{19}$ | $9.4 \times 10^{-6}$ | 41 |
| 14 | $8.90 \times 10^{19}$ | $4.6 \times 10^{-6}$ | 32 |
| 15 | $3.60 \times 10^{20}$ | $2.4 \times 10^{-6}$ | 29 |
| 16 | $1.00 \times 10^{21}$ | $1.7 \times 10^{-6}$ | 25 |
| 17 | $1.02 \times 10^{20}$ | $2.4 \times 10^{-6}$ | 35 |
| 18 | $4.90 \times 10^{20}$ | $1.9 \times 10^{-6}$ | 45 |
| 19 | $9.20 \times 10^{19}$ | $2.6 \times 10^{-5}$ | 38 |
| 20 | $1.80 \times 10^{20}$ | $2.0 \times 10^{-6}$ | 36 |
| 21 | $7.40 \times 10^{20}$ | $1.6 \times 10^{-6}$ | 42 |
| 22 | $6.70 \times 10^{17}$ | $9.60 \times 10^{-5}$ | 94 |
| 23 | $4.90 \times 10^{19}$ | $1.30 \times 10^{-5}$ | 88 |

TABLE 12-2-continued

| | | Characteristics | |
|---|---|---|---|
| No. | Carrier concentration $n(M/m^3)$ | Electrical conductivity $\rho(\Omega \cdot m)$ | Thermal conductivity $\kappa(W/m \cdot K)$ |
| 24 | $3.70 \times 10^{20}$ | $7.90 \times 10^{-6}$ | 67 |
| 25 | $9.80 \times 10^{20}$ | $3.30 \times 10^{-6}$ | 46 |
| 26 | $2.40 \times 10^{21}$ | $9.60 \times 10^{-7}$ | 45 |
| 27 | $2.80 \times 10^{20}$ | $8.30 \times 10^{-6}$ | 54 |
| 28 | $1.80 \times 10^{20}$ | $6.70 \times 10^{-6}$ | 58 |
| | | 12a | |
| 24 | $4.50 \times 10^{19}$ | $2.80 \times 10^{-5}$ | 15 |
| 25 | $3.70 \times 10^{19}$ | $3.40 \times 10^{-5}$ | 9 |

TABLE 13-1

| | | Dopant | | Dopant | |
|---|---|---|---|---|---|
| No | Matrix | Element name | Added amount (at %) | Element name | Added amount (at %) |
| | | Embodiment 13 | | | |
| 31 | Si | Bi | 0.1 | Ti | 0.1 |
| 32 | Si | Bi | 0.5 | Ti | 0.5 |
| 33 | Si | Bi | 1.5 | Ti | 1.5 |
| 34 | Si | Bi | 3 | Ti | 3 |
| 35 | Si | Bi | 6 | Ti | 6 |
| 36 | Si | Bi | 1.5 | V | 1.5 |
| 37 | Si | Bi | 1.5 | Mn | 1.5 |
| 38 | Si | Bi | 1.5 | Fe | 1.5 |
| 39 | Si | Bi | 1.5 | Co | 1.5 |
| 40 | Si | Bi | 0.1 | Ni | 0.1 |
| 41 | Si | Bi | 0.5 | Ni | 0.5 |
| 42 | Si | Bi | 1.5 | Ni | 1.5 |
| 43 | Si | Bi | 3 | Ni | 3 |
| 44 | Si | Bi | 6 | Ni | 6 |
| 45 | Si | Bi | 1.5 | Cu | 1.5 |
| 46 | Si | Bi | 0.1 | La | 0.1 |
| 47 | Si | Bi | 0.5 | La | 0.5 |
| 48 | Si | Bi | 1.5 | La | 1.5 |
| 49 | Si | Bi | 3 | La | 3 |
| 50 | Si | Bi | 6 | La | 6 |
| 51 | Si | Bi | 1.5 | Ce | 1.5 |
| 52 | Si | Bi | 1.5 | Pr | 1.5 |
| 53 | Si | Bi | 1.5 | Nd | 1.5 |
| 54 | Si | Bi | 1.5 | Sm | 1.5 |
| 55 | Si | Bi | 1.5 | Dy | 1.5 |
| 56 | Si | P | 1.5 | Ni | 1.5 |
| 57 | Si | O | 0.75 | Ni | 1.5 |
| 58 | Si | N | 1.5 | Ni | 1.5 |
| | | 13a | | | |
| 59 | Si—Ge | P | 3 | | |
| 60 | Si—Ge | Bi | 3 | | |

TABLE 13-2

| | | Characteristics | |
|---|---|---|---|
| No. | Carrier concentration $n(M/m^3)$ | Electrical conductivity $\rho(\Omega \cdot m)$ | Thermal conductivity $\kappa(W/m \cdot K)$ |
| | | Embodiment 13 | |
| 31 | $7.90 \times 10^{17}$ | $3.60 \times 10^{-4}$ | 93 |
| 32 | $3.70 \times 10^{19}$ | $2.60 \times 10^{-5}$ | 68 |
| 33 | $2.40 \times 10^{20}$ | $4.80 \times 10^{-6}$ | 45 |
| 34 | $5.70 \times 10^{20}$ | $2.4 \times 10^{-6}$ | 37 |
| 35 | $1.60 \times 10^{21}$ | $8.20 \times 10^{-7}$ | 32 |

TABLE 13-2-continued

| | | Characteristics | |
|---|---|---|---|
| No. | Carrier concentration $n(M/m^3)$ | Electrical conductivity $\rho(\Omega \cdot m)$ | Thermal conductivity $\kappa(W/m \cdot K)$ |
| 36 | $6.30 \times 10^{19}$ | $6.20 \times 10^{-6}$ | 41 |
| 37 | $7.20 \times 10^{19}$ | $6.50 \times 10^{-6}$ | 39 |
| 38 | $7.20 \times 10^{19}$ | $6.50 \times 10^{-6}$ | 39 |
| 39 | $7.80 \times 10^{19}$ | $8.60 \times 10^{-6}$ | 34 |
| 40 | $4.10 \times 10^{18}$ | $7.90 \times 10^{-4}$ | 42 |
| 41 | $8.60 \times 10^{19}$ | $4.70 \times 10^{-6}$ | 42 |
| 42 | $7.40 \times 10^{20}$ | $2.0 \times 10^{-6}$ | 42 |
| 43 | $7.40 \times 10^{20}$ | $1.3 \times 10^{-6}$ | 38 |
| 44 | $7.40 \times 10^{20}$ | $1.1 \times 10^{-6}$ | 33 |
| 45 | $4.60 \times 10^{20}$ | $3.40 \times 10^{-6}$ | 48 |
| 46 | $2.70 \times 10^{18}$ | $4.20 \times 10^{-4}$ | 68 |
| 47 | $6.90 \times 10^{19}$ | $9.40 \times 10^{-5}$ | 34 |
| 48 | $3.50 \times 10^{20}$ | $7.4 \times 10^{-6}$ | 31 |
| 49 | $6.70 \times 10^{20}$ | $5.2 \times 10^{-6}$ | 29 |
| 50 | $1.40 \times 10^{21}$ | $2.6 \times 10^{-6}$ | 27 |
| 51 | $3.90 \times 10^{20}$ | $6.8 \times 10^{-6}$ | 29 |
| 52 | $4.60 \times 10^{20}$ | $5.6 \times 10^{-6}$ | 27 |
| 53 | $4.10 \times 10^{20}$ | $6.2 \times 10^{-6}$ | 33 |
| 54 | $4.70 \times 10^{20}$ | $5.8 \times 10^{-6}$ | 30 |
| 55 | $5.30 \times 10^{20}$ | $5.0 \times 10^{-6}$ | 34 |
| 56 | $8.90 \times 10^{20}$ | $4.0 \times 10^{-6}$ | 41 |
| 57 | $6.90 \times 10^{20}$ | $4.8 \times 10^{-6}$ | 45 |
| 58 | $6.50 \times 10^{20}$ | $5.4 \times 10^{-6}$ | 44 |
| | | 13a | |
| 59 | $1.02 \times 10^{20}$ | $3.80 \times 10^{-5}$ | 8 |
| 60 | $9.70 \times 10^{19}$ | $2.60 \times 10^{-5}$ | 13 |

Embodiment 14

To produce a silicon-based conductive material, high-purity single crystal silicon (10N) and the elements shown in Tables 14-1 and 14-4 were measured out in the specified proportions and then arc melted in an argon gas atmosphere in the standard way, immediately after which the melt was quenched by being held down with a chiller from above, which produced a sample. For the sake of comparison, the sample arc melted in the standard way was heat treated at about 1000° C. to grow crystal grains and produce a comparative sample.

The arc melting crucible was in the shape of an inverted and truncated cone, as shown in FIG. 6. The inside diameter at the top was 60 mm, the inside diameter at the bottom was 40 mm, and the depth was 30 mm. The chiller was made of copper and was designed to fit into this crucible. In order to boost the cooling efficiency, the chiller was machined to a thickness of 50 mm so that its thermal capacity would be larger.

The dimensions of the button-shaped ingots thus obtained were 40 mm outside diameter×4 mm. These ingots were cut into sizes of 5×5×3 mm, 10×10×2 mm, and 10 mm outside diameter×2 mm, and the carrier concentration, electrical resistivity, and thermal conductivity of each were measured. These measurement results are given in Tables 14-1 and 14-2.

The average grain diameter was measured after first polishing and then chemically etching the sample. The average grain diameter of a sample arc melted in the standard way was about 10 to 20 μm. The state of precipitation of the dopant inside the crystal grains and at the grain boundary was observed by EPMA, and as a result the dopant was seen to be dispersed along the grain boundary with a quenched sample, but was locally present in bands substantially continuously along the grain boundary with the two types of sample not quenched.

Embodiments 15

To produce an n-type silicon semiconductor, high-purity single crystal silicon (10N). and the elements shown in Tables 15-1 and 15-2 were measured out in the specified proportions and then arc melted in an argon gas atmosphere in the standard way to produce two types of sample: an arc-melted sample and a sample quenched by being held down with a chiller from above immediately after arc melting. For the sake of comparison, the sample arc melted in the standard way was heat treated at about 1000° C. to grow crystal grains and produce a comparative sample. The quenching method after arc melting was the same as in Embodiment 14.

The dimensions of the button-shaped ingots thus obtained were 40 mm outside diameter×4 mm. These ingots were cut into sizes of 5×5×3 mm, 10×10×2 mm, and 10 mm outside diameter×2 mm, and the carrier concentration, electrical resistivity, and thermal conductivity of each were measured. These measurement results are given in Tables 15-1 and 15-2.

The average grain diameter was measured after first polishing and then chemically etching the sample. The average grain diameter of a sample arc melted in the standard way was about 10 to 20 $\mu$m. The state of precipitation of the dopant inside the crystal grains and at the grain boundary was observed by EPMA, and as a result the dopant was seen to be dispersed along the grain boundary with a quenched sample, but was locally present in bands substantially continuously along the grain boundary with the two types of sample not quenched.

TABLE 14-1

|  | No | Matrix | Dopant | Dopant Added amount (at %) | Average grain diameter ($\mu$m) | Electrical conductivity p($\Omega \cdot$ m) | Thermal conductivity k(W/mK) |
|---|---|---|---|---|---|---|---|
| Quenching | 1 | Si | Al | 0.10 | 4.5 | $5.0 \times 10^{-5}$ | 37.7 |
|  | 2 | Si | Al | 1.0 | 3.4 | $8.4 \times 10^{-6}$ | 33.7 |
|  | 3 | Si | Al | 3.0 | 2.8 | $7.4 \times 10^{-6}$ | 29.3 |
|  | 4 | Si | Al | 5.0 | 2.2 | $3.0 \times 10^{-6}$ | 26 |
|  | 5 | Si | Ga | 3.0 | 3.1 | $6.4 \times 10^{-6}$ | 21.7 |
|  | 6 | Si | In | 3.0 | 2.5 | $6.8 \times 10^{-6}$ | 18 |
|  | 7 | Si | Zn | 1.5 | 3.2 | $4.6 \times 10^{-6}$ | 20 |
|  | 8 | Si | Al Y | 1.5 0.5 | 2.7 | $7.8 \times 10^{-6}$ | 17 |
|  | 9 | Si | Y | 3.0 | 4.8 | $6.4 \times 10^{-6}$ | 19 |
|  | 10 | Si | Mo | 3.0 | 2.2 | $8.6 \times 10^{-6}$ | 17.3 |
|  | 11 | Si | Zr | 3.0 | 3.5 | $6.0 \times 10^{-6}$ | 17.7 |
|  | 12 | Si | Be | 3.0 | 2.8 | $4.6 \times 10^{-6}$ | 32 |
|  | 13 | Si | Mg | 3.0 | 4.3 | $5.2 \times 10^{-6}$ | 27 |

TABLE 14-2

|  | No | Matrix | Dopant | Dopant Added amount (at %) | Average grain diameter ($\mu$m) | Electrical conductivity p($\Omega \cdot$ m) | Thermal conductivity k(W/mK) |
|---|---|---|---|---|---|---|---|
| No quenching (heat treated) | 16 | Si | Al | 3.0 | 15 | $9.3 \times 10^{-6}$ | 48 |
|  | 17 | Si | Ga | 3.0 | 18 | $7.0 \times 10^{-6}$ | 37 |
|  | 18 | Si | Al Y | 1.5 0.5 | 11 | $9.7 \times 10^{-6}$ | 32 |
|  | 19 | Si | Mo | 3.0 | 17 | $1.6 \times 10^{-5}$ | 30 |
|  | 20 | Si | Be | 3.0 | 19 | $9.3 \times 10^{-6}$ | 45 |
|  | 21 | Si | Al | 3.0 | 46 | $1.97 \times 10^{-5}$ | 67 |
|  | 22 | Si | Ga | 3.0 | 53 | $8.3 \times 10^{-6}$ | 63 |
|  | 23 | Si | Al Y | 1.5 0.5 | 35 | $1.07 \times 10^{-5}$ | 57 |
|  | 24 | Si | Mo | 3.0 | 56 | $1.8 \times 10^{-5}$ | 48 |
|  | 25 | Si | Be | 3.0 | 68 | $1.2 \times 10^{-5}$ | 51 |

TABLE 15-1

| | No | Matrix | Dopant | Added amount (at %) | Average grain diameter ($\mu$m) | Electrical conductivity p($\Omega \cdot$ m) | Thermal conductivity k(W/mK) |
|---|---|---|---|---|---|---|---|
| Quenching | 26 | Si | P | 0.10 | 4.8 | $2.6 \times 10^{-5}$ | 43 |
| | 27 | Si | P | 1.0 | 3.6 | $7.2 \times 10^{-6}$ | 37 |
| | 28 | Si | P | 3.0 | 2.9 | $4.8 \times 10^{-6}$ | 30 |
| | 29 | Si | P | 5.0 | 1.5 | $3.6 \times 10^{-6}$ | 26 |
| | 30 | Si | Sb | 3.0 | 3.4 | $4.8 \times 10^{-6}$ | 21 |
| | 31 | Si | Bi | 3.0 | 2.3 | $3.4 \times 10^{-6}$ | 16 |
| | 32 | Si | P<br>Nd | 1.5<br>0.5 | 2.5 | $6.4 \times 10^{-6}$ | 15 |
| | 33 | Si | Bi<br>Dy | 1.5<br>0.5 | 2.8 | $4.2 \times 10^{-6}$ | 13 |
| | 34 | Si | Cr | 3.0 | 3.1 | $7.2 \times 10^{-6}$ | 25 |
| | 35 | Si | Fe | 3.0 | 2.5 | $4.2 \times 10^{-6}$ | 24 |
| | 36 | Si | Nb | 3.0 | 4.3 | $5.0 \times 10^{-6}$ | 23 |
| | 37 | Si | Ag | 3.0 | 4.8 | $2.8 \times 10^{-6}$ | 21 |
| | 38 | Si | Nd | 3.0 | 1.2 | $7.2 \times 10^{-6}$ | 17 |
| | 39 | Si | La | 3.0 | 1.5 | $8.4 \times 10^{-6}$ | 18 |
| | 40 | Si | Fe<br>La | 1.5<br>1.5 | 2.0 | $6.4 \times 10^{-6}$ | 25 |

TABLE 15-2

| | No | Matrix | Dopant | Added amount (at %) | Average grain diameter ($\mu$m) | Electrical conductivity p($\Omega \cdot$ m) | Thermal conductivity k(W/mK) |
|---|---|---|---|---|---|---|---|
| No quenching (heat treated) | 41 | Si | P | 3.0 | 14 | $6.5 \times 10^{-6}$ | 48 |
| | 42 | Si | Bi | 3.0 | 17 | $4.5 \times 10^{-6}$ | 37 |
| | 43 | Si | P<br>Nd | 1.5<br>0.5 | 12 | $7.0 \times 10^{-6}$ | 27 |
| | 44 | Si | Fe | 3.0 | 15 | $5.8 \times 10^{-6}$ | 34 |
| | 45 | Si | La | 3.0 | 12 | $1.1 \times 10^{-5}$ | 28 |
| | 46 | Si | P | 3.0 | 36 | $7.0 \times 10^{-6}$ | 63 |
| | 47 | Si | Bi | 3.0 | 58 | $4.3 \times 10^{-6}$ | 52 |
| | 48 | Si | P<br>Nd | 1.5<br>0.5 | 27 | $6.5 \times 10^{-6}$ | 47 |
| | 49 | Si | Fe | 3.0 | 39 | $8.8 \times 10^{-6}$ | 42 |
| | 50 | Si | Nd | 3.0 | 46 | $1.3 \times 10^{-5}$ | 37 |

Embodiment 16

To produce a p-type silicon semiconductor, high-purity single crystal silicon (1ON) and the various elements shown in Table 16-1 were measured out in the specified proportions and then arc melted in an argon gas atmosphere. The button-shaped ingots thus obtained were coarsely ground and ground in a disk mill, after which they were ground in a jet mill to produce powders with the average particle diameters shown in Table 1. Each powder was then held for 3 hours under the hot pressing conditions shown in Tables 16-2 and 16-3 to produce sinters having various porosities as shown in Table 16-2.

The button-shaped ingots thus obtained were mechanically alloyed for 50 hours in an argon atmosphere, after which they. were held for 3 hours under the hot pressing conditions shown in Tables 16-2 and 16-3 to produce sinters having the various average grain diameters shown in Table 16-3.

The sinters thus obtained were cut into sizes of 5×5×5 mm, 10×10×2 mm, and 10 mm outside diameter×2 mm, and the carrier concentration, electrical resistivity, and thermal conductivity of each were measured. These measurement results are given in Tables 16-1, 16-2, and 16-3.

Embodiment 17

To produce an n-type silicon semiconductor, high-purity single crystal silicon (1ON) and the various elements shown in Table 17-1 were measured out in the specified proportions and then arc melted in an argon gas atmosphere. The button-shaped ingots thus obtained were coarsely ground and ground in a disk mill, after which they were ground in a jet mill to produce powders with the average particle diameters shown in Table 17-1. Each powder was then held for 3 hours under the hot pressing conditions shown in Table 17-2 to produce sinters having various porosities as shown in Table 17-3.

The button-shaped ingots thus obtained were mechanically alloyed for 50 hours in an argon atmosphere, after which they were held for 3 hours under the hot pressing conditions shown in Table 17-3 to produce sinters having the various average grain diameters'shown in Table 17-5. The sinters thus obtained were worked into the same sizes as in Embodiment 1 to produce various measurement samples. Thermal conductivity was measured under the same conditions in Embodiment 1. These measurement results are given in Tables 17-2 and 17-3.

TABLE 16-1

Embodiment 16

| Sample No | Matrix | Dopant | Added amount (at %) | Carrier concentration (M/m$^3$) | Average grain diameter μm |
|---|---|---|---|---|---|
| 1 | Si | Al | 3.0 | 1.1 × 10$^{21}$ | 2.7 |
| 2 | Si | Ga | 3.0 | 1.2 × 10$^{21}$ | 3.0 |
| 3 | Si | Zn | 3.0 | 1.8 × 10$^{21}$ | 2.8 |
| 4 | Si | Be | 3.0 | 1.0 × 10$^{21}$ | 3.2 |
| 5 | Si | Mo | 3.0 | 0.9 × 10$^{21}$ | 2.9 |
| 6 | Si | Al | 1.5 | 1.0 × 10$^{21}$ | 3.0 |
|   |    | Mo | 1.5 |  |  |

TABLE 17-1

Embodiment 17

| Sample No | Matrix | Dopant | Added amount (at %) | Carrier concentration (M/m$^3$) | Average ground particle diameter μm |
|---|---|---|---|---|---|
| 7 | Si | P | 3.0 | 2.8 × 10$^{20}$ | 2.6 |
| 8 | Si | Sb | 3.0 | 2.8 × 10$^{20}$ | 2.8 |
| 9 | Si | Bi | 3.0 | 3.5 × 10$^{20}$ | 2.8 |
| 10 | Si | Cr | 3.0 | 3.4 × 10$^{20}$ | 3.5 |
| 11 | Si | La | 3.0 | 3.5 × 10$^{20}$ | 2.9 |

TABLE 16-2

|  | No | Sample No | Hot pressing conditions Temperature °C | Pressure MP | Porosity % | Average grain diameter μm | Electrical conductivity p(Ωm) | Thermal conductivity k(W/mK) |
|---|---|---|---|---|---|---|---|---|
| Embodiment 16 | 1 | 1 | — | — | 0 | 15 | 1.2 × 10$^{-5}$ | 56 |
|  | 2 | 1 | 1000 | 49 | 47 | 3 | 2.8 × 10$^{-5}$ | 19 |
|  | 3 | 1 | 1000 | 98 | 40 | 4 | 1.5 × 10$^{-5}$ | 24 |
|  | 4 | 1 | 1000 | 196 | 32 | 5 | 1.4 × 10$^{-5}$ | 33 |
|  | 5 | 1 | 1000 | 294 | 26 | 5 | 1.3 × 10$^{-5}$ | 37 |
|  | 6 | 1 | 1200 | 49 | 15 | 8 | 1.3 × 10$^{-5}$ | 42 |
|  | 7 | 1 | 1200 | 98 | 11 | 9 | 1.3 × 10$^{-5}$ | 44 |
|  | 8 | 1 | 1200 | 147 | 8 | 10 | 1.3 × 10$^{-5}$ | 46 |
|  | 9 | 1 | 1200 | 196 | 6 | 12 | 1.2 × 10$^{-5}$ | 47 |
|  | 10 | 1 | 1200 | 245 | 5 | 13 | 1.2 × 10$^{-5}$ | 50 |
|  | 11 | 1 | 1250 | 245 | 2 | 15 | 1.2 × 10$^{-5}$ | 55 |
|  | 12 | 2 | 1000 | 196 | 28 | 6 | 1.4 × 10$^{-5}$ | 36 |
|  | 13 | 3 | 1000 | 196 | 31 | 6 | 1.4 × 10$^{-5}$ | 34 |

TABLE 16-3

|  | No | Sample No | Hot pressing conditions Temperature °C | Pressure MP | Porosity % | Average grain diameter μm | Electrical conductivity p(Ωm) | Thermal conductivity k(W/mK) |
|---|---|---|---|---|---|---|---|---|
| Embodiment 16 | 14 | 1 | 800 | 294 | 12 | 0.05 | 3.3 × 10$^{-5}$ | 19 |
|  | 15 | 1 | 900 | 245 | 10 | 0.10 | 2.1 × 10$^{-5}$ | 21 |
|  | 16 | 1 | 1000 | 196 | 10 | 0.90 | 1.6 × 10$^{-5}$ | 24 |
|  | 17 | 1 | 1100 | 98 | 9 | 2.4 | 1.4 × 10$^{-5}$ | 27 |
|  | 18 | 1 | 1200 | 49 | 8 | 5.0 | 1.3 × 10$^{-5}$ | 32 |
|  | 19 | 1 | 1250 | 24 | 7 | 8.4 | 1.2 × 10$^{-5}$ | 45 |
|  | 20 | 2 | 1100 | 98 | 8 | 3.1 | 1.4 × 10$^{-5}$ | 29 |
|  | 21 | 3 | 1100 | 98 | 8 | 2.8 | 1.5 × 10$^{-5}$ | 27 |
|  | 22 | 4 | 800 | 294 | 15 | 0.11 | 3.6 × 10$^{-5}$ | 20 |
|  | 23 | 4 | 900 | 294 | 8 | 0.35 | 2.6 × 10$^{-5}$ | 22 |
|  | 24 | 5 | 800 | 294 | 19 | 0.12 | 3.7 × 10$^{-5}$ | 21 |
|  | 25 | 5 | 900 | 294 | 11 | 0.31 | 3.0 × 10$^{-5}$ | 24 |
|  | 26 | 6 | 800 | 294 | 9 | 0.14 | 3.4 × 10$^{-5}$ | 23 |

TABLE 17-1-continued

Embodiment 17

| Sample No | Matrix | Dopant | Dopant Added amount Added amount (at %) | Carrier concentration (M/m³) | Average ground particle diameter μm |
|---|---|---|---|---|---|
| 12 | Si | P | 1.5 | $3.0 \times 10^{20}$ | 3.4 |
|  |  | Cr | 1.5 |  |  |
|  |  | P | 1.0 |  |  |
| 13 | Si | Cr | 1.0 | $3.2 \times 10^{20}$ | 3.1 |
|  |  | La | 1.0 |  |  |

TABLE 17-2

|  | No | Sample No | Hot pressing conditions Temperature °C | Pressure MP | Porosity % | Average grain diameter μm | Characteristics Electrical conductivity p(Ωm) | Thermal conductivity k(W/mK) |
|---|---|---|---|---|---|---|---|---|
| Embodiment 17 | 27 | 7 | — | — | 0 | 14 | $1.3 \times 10^{-5}$ | 30 |
|  | 28 | 7 | 1000 | 49 | 45 | 3 | $2.9 \times 10^{-5}$ | 9 |
|  | 29 | 7 | 1000 | 98 | 40 | 4 | $1.9 \times 10^{-5}$ | 13 |
|  | 30 | 7 | 1000 | 196 | 31 | 5 | $1.7 \times 10^{-5}$ | 15 |
|  | 31 | 7 | 1000 | 294 | 24 | 6 | $1.6 \times 10^{-5}$ | 17 |
|  | 32 | 7 | 1200 | 49 | 17 | 8 | $1.4 \times 10^{-5}$ | 19 |
|  | 33 | 7 | 1200 | 98 | 13 | 9 | $1.4 \times 10^{-5}$ | 21 |
|  | 34 | 7 | 1200 | 147 | 9 | 10 | $1.4 \times 10^{-5}$ | 22 |
|  | 35 | 7 | 1200 | 196 | 7 | 12 | $1.4 \times 10^{-5}$ | 23 |
|  | 36 | 7 | 1200 | 245 | 5 | 13 | $1.3 \times 10^{-5}$ | 25 |
|  | 37 | 7 | 1250 | 245 | 2 | 14 | $1.3 \times 10^{-5}$ | 29 |
|  | 38 | 8 | 1000 | 196 | 27 | 6 | $1.6 \times 10^{-5}$ | 18 |
|  | 39 | 9 | 1000 | 196 | 30 | 6 | $1.7 \times 10^{-5}$ | 17 |

TABLE 17-3

|  | No | Sample No | Hot pressing conditions Temperature °C | Pressure MP | Porosity % | Average grain diameter μm | Characteristics Electrical conductivity p(Ωm) | Thermal conductivity k(W/mK) |
|---|---|---|---|---|---|---|---|---|
| Embodiment 17 | 40 | 7 | 800 | 294 | 9 | 0.06 | $2.9 \times 10^{-5}$ | 13 |
|  | 41 | 7 | 900 | 245 | 8 | 0.10 | $1.7 \times 10^{-5}$ | 16 |
|  | 42 | 7 | 1000 | 196 | 7 | 1.0 | $1.6 \times 10^{-5}$ | 19 |
|  | 43 | 7 | 1100 | 98 | 7 | 2.3 | $1.5 \times 10^{-5}$ | 21 |
|  | 44 | 7 | 1200 | 49 | 5 | 5.0 | $1.4 \times 10^{-5}$ | 24 |
|  | 45 | 7 | 1250 | 24 | 4 | 8.6 | $1.4 \times 10^{-5}$ | 26 |
|  | 46 | 8 | 1100 | 98 | 5 | 3.4 | $1.5 \times 10^{-5}$ | 24 |
|  | 47 | 9 | 1100 | 98 | 5 | 3.5 | $1.6 \times 10^{-5}$ | 23 |
|  | 48 | 10 | 1000 | 196 | 11 | 1.4 | $2.5 \times 10^{-5}$ | 25 |
|  | 49 | 11 | 1000 | 196 | 9 | 1.8 | $1.6 \times 10^{-5}$ | 17 |
|  | 50 | 12 | 1000 | 196 | 9 | 1.5 | $1.8 \times 10^{-5}$ | 24 |
|  | 51 | 12 | 1100 | 98 | 8 | 2.4 | $1.6 \times 10^{-5}$ | 27 |
|  | 52 | 13 | 1000 | 196 | 8 | 1.2 | $1.1 \times 10^{-5}$ | 21 |

Embodiment 18

To produce a p-type silicon semiconductor, high-purity silicon (10N) or low-purity silicon (3N) and the silicon-based compounds shown in Table 18 were compounded in the specified proportions, after which they were arc melted in an argon gas atmosphere such that the carrier concentration was $10^{20}$ (M/m³). The button-shaped ingots thus obtained were cut into sizes of 5×5×5 mm, 10×10×2 mm, and 10 mm outside diameter×2 mm, and the carrier concentration, electrical resistivity, and thermal conductivity of each were measured. These measurement results are given in Table 18.

As can be seen from Table 18, when the dopant is a silicon compound, very little of the molten dopant evaporates and scatters, as indicated by the analysis values after melting, with at least 95% of the dopant remaining. This makes it possible to control the added amount more accurately.

Embodiment 19

To produce an n-type silicon semiconductor, high-purity silicon (10N) or low-purity silicon (3N) and the silicon-based compounds shown in Table 19 were compounded in the specified proportions, after which they were arc melted in an argon gas atmosphere such that the carrier concentration was $10^{20}$ (M/m³). The button-shaped ingots thus obtained were cut into sizes of 5×5×5 mm, 10×10×2 mm, and 10 mm outside diameter×2 mm, and the carrier concentration, electrical resistivity, and thermal conductivity of each were measured. These measurement results are given in Table 19.

As can be seen from Table 19, when the dopant is a silicon compound, very little of the molten dopant evaporates and scatters, as indicated by the analysis values after melting, with at least 95% of the dopant remaining. This makes it possible to control the added amount more accurately.

TABLE 18

| No | Purity of matrix silicon | Dopant Element name | Dopant Added substance | Added amount of dopant (at %) | Analysis value after melting (at %) | Carrier concentration n(M/m$^3$) | Electrical conductivity p(Ωm) | Thermal conductivity k(w/mK) |
|---|---|---|---|---|---|---|---|---|
| 1 | 10N | Al | Al$_4$Si | 3.00 | 2.95 | 1.6 × 10$^{20}$ | 4.0 × 10$^{-6}$ | 51 |
| 2 | 10N | B | B$_4$Si | 3.00 | 2.82 | 1.0 × 10$^{20}$ | 6.4 × 10$^{-6}$ | 43 |
| 3 | 10N | Mg | Mg$_2$Si | 3.00 | 2.89 | 3.2 × 10$^{20}$ | 5.6 × 10$^{-6}$ | 53 |
| 4 | 10N | Ba | Ba$_2$Si | 3.00 | 2.91 | 2.5 × 10$^{20}$ | 1.4 × 10$^{-5}$ | 39 |
| 5 | 3N | Al | Al$_4$Si | 3.00 | 2.94 | 1.5 × 10$^{20}$ | 4.0 × 10$^{-6}$ | 51 |
| 6 | 10N | B | B$_4$Si | 3.00 | 2.95 | 1.0 × 10$^{20}$ | 4.4 × 10$^{-6}$ | 42 |
| 7 | 10N | Y | Y$_3$Si$_5$ | 3.00 | 2.85 | 1.2 × 10$^{20}$ | 8.4 × 10$^{-6}$ | 49 |
| 8 | 10N | Mo | Mo$_3$Si | 3.00 | 2.91 | 1.8 × 10$^{20}$ | 6.2 × 10$^{-6}$ | 19 |
| 9 | 10N | Al, B | AlB$_2$ | 3.00 | 2.65 | 8.7 × 10$^{19}$ | 9.2 × 10$^{-6}$ | 48 |
| 10 | 3N | Al | Al | 3.00 | 2.35 | 9.9 × 10$^{19}$ | 7.2 × 10$^{-6}$ | 55 |

TABLE 19

| No | Purity of matrix silicon | Dopant Element name | Dopant Added substance | Added amount of dopant (at %) | Analysis value after melting (at %) | Carrier concentration n(M/m$^3$) | Electrical conductivity p(Ωm) | Thermal conductivity k(w/mK) |
|---|---|---|---|---|---|---|---|---|
| 11 | 10N | P | SiP | 3.00 | 2.91 | 1.3 × 10$^{20}$ | 6.9 × 10$^{-6}$ | 42 |
| 12 | 10N | S | SiS$_2$ | 3.00 | 2.92 | 1.9 × 10$^{20}$ | 1.0 × 10$^{-5}$ | 68 |
| 13 | 10N | O | SiO$_2$ | 3.00 | 2.95 | 1.8 × 10$^{20}$ | 9.8 × 10$^{-6}$ | 75 |
| 14 | 10N | As | SiAs$_2$ | 3.00 | 2.86 | 1.0 × 10$^{20}$ | 1.2 × 10$^{-6}$ | 82 |
| 15 | 3N | N | Si$_3$N$_4$ | 3.00 | 2.95 | 1.8 × 10$^{20}$ | 4.3 × 10$^{-6}$ | 56 |
| 16 | 3N | P | SiP | 3.00 | 2.92 | 1.4 × 10$^{20}$ | 7.1 × 10$^{-6}$ | 41 |
| 17 | 10N | Co | CoSi | 3.00 | 2.92 | 2.1 × 10$^{20}$ | 8.2 × 10$^{-6}$ | 45 |
| 18 | 10N | Ce | CeSi$_2$ | 3.00 | 2.86 | 1.6 × 10$^{20}$ | 9.3 × 10$^{-6}$ | 36 |
| 19 | 10N | P, O | P$_2$O$_5$ | 3.00 | 1.95 | 6.3 × 10$^{19}$ | 7.8 × 10$^{-6}$ | 62 |
| 20 | 10N | P, S | P$_2$S$_5$ | 3.00 | 2.13 | 7.5 × 10$^{19}$ | 8.7 × 10$^{-6}$ | 85 |
| 21 | 10N | P | P | 3.00 | 2.32 | 7.3 × 10$^{19}$ | 4.8 × 10$^{-5}$ | 62 |

Embodiment 20

To produce a silicon-based conductive material, a high-purity monocrystalline silicon (10N) substrate is doped with boron in such a manner as to draw a thin line, by using an ion beam device, such that silicon in an area of a predetermined width and of a predetermined depth contains 3 at % boron. Measurement of the electrical conductivity of the doped area revealed that the doped area had a electrical conductivity of around 10-5(Ω·m). It was also also found that the conductive material thus obtained showed properties equivalent to those of the conductive material containing 3 at % boron obtained by the melting as described earlier.

INDUSTRIAL APPLICABILITY

The electrical resistance of the silicon-based conductive material of the present invention can be lowered by adding the various required elements, transition metal elements, or rare earth elements to silicon having a diamond-type crystal structure, and making adjustments by suitably selecting the type and amount of the dopants. Quenching produces a structure in which the average grain diameter of the semiconductor is fine and a grain boundary phase exhibiting metal or semi-metal conduction is dispersed, which yields a silicon-based conductive material having excellent conductivity (electrical resistivity of 10$^{-5}$ (Ω·m) or less). It is also possible to obtain a conductive material having excellent conductivity (electrical resistivity of 10$^{-5}$ (Ω·m) or less);by having atoms of other elements substantially dispersed among the silicon lattices.

The silicon-based conductive material of the present invention can be used in any application that requires electrical conductivity, and it can be used in any form as dictated by the application, such as a sheet, rod, spheres, ribbon, or microparticles. For instance, the raw material melted along with the required elements can be molded into a conductive part in the form of a sheet, rod, wire, or other required shape, or a thin film can be produced by vapor phase growth and patterned, or phosphorus or boron can be implanted in a silicon substrate with an ion beam and patterned, allowing the conduction path to be formed as desired.

What is claimed is:

1. A method for manufacturing a silicon-based conductive material, in which a melt composed of silicon containing at least one other element in an amount of at least 0.001 and no more than 20 at % is quenched to yield a structure having an electrical resistivity p of no more than 1×10$^{-3}$ Ω·m and composed of a semiconductor grain phase and a conductor grain phase of a metal or semi-meal dispersed in bulk.

2. The method for manufacturing a silicon-base conductive material according to claim 1, wherein the quenching method involves quenching with a chiller.

3. The method for manufacturing a silicon-based conductive material according to claim 1, wherein the quenching method involves splat-cooling through contact with a rotating roll so that most or all of the material is rendered amorphous, then heat treating this product.

4. The method for manufacturing a silicon-based conductive material according to claim 1, wherein the quenching method involves quenching the melt so that the average grain size is 0.1 to 5 µm.

5. A method for manufacturing a silicon-based conductive material, in which a melt composed of silicon containing at least one other element in an amount of at least 0.001 and no more than 20 at % is quenched and then heat treated to yield a structure having an electrical resistivity p of no more than $1\times10^{-3}$ (Ω·m) and composed of a semiconductor grain phase of a metal or semi-metal dispersed in bulk.

* * * * *